US012796551B2

(12) United States Patent
Badaroglu et al.

(10) Patent No.: US 12,796,551 B2
(45) Date of Patent: Nov. 10, 2026

(54) SINGLE-STEP VIA-LAST PROCESS FOR MULTI-STACK WAFERS

(71) Applicant: QUALCOMM Incorporated, San Diego, CA (US)

(72) Inventors: Mustafa Badaroglu, San Diego, CA (US); Jihong Choi, San Diego, CA (US); Giridhar Nallapati, San Diego, CA (US); Sivakumar Kumarasamy, San Diego, CA (US); Zhongze Wang, San Diego, CA (US); Woo Tag Kang, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 660 days.

(21) Appl. No.: 18/348,777

(22) Filed: Jul. 7, 2023

(65) Prior Publication Data

US 2025/0015047 A1 Jan. 9, 2025

(51) Int. Cl.

| | |
|---|---|
| ***H01L 25/065*** | (2023.01) |
| ***H10W 20/00*** | (2026.01) |
| ***H10W 20/20*** | (2026.01) |
| ***H10W 20/41*** | (2026.01) |
| ***H10W 90/00*** | (2026.01) |
| *H10W 90/20* | (2026.01) |

(52) U.S. Cl.

CPC ......... *H10W 90/00* (2026.01); *H10W 20/023* (2026.01); *H10W 20/20* (2026.01); *H10W 20/425* (2026.01); *H10W 90/297* (2026.01)

(58) Field of Classification Search

CPC ... H10W 90/00; H10W 20/425; H10W 20/20; H10W 20/023; H10W 90/297

See application file for complete search history.

(56) References Cited

U.S. PATENT DOCUMENTS

2011/0186990 A1* 8/2011 Mawatari ............ H10W 40/228 257/737
2023/0123423 A1* 4/2023 Gao .................... H10W 20/497 257/428

* cited by examiner

*Primary Examiner* — Victor A Mandala
*Assistant Examiner* — Colleen E Snow
(74) *Attorney, Agent, or Firm* — Seyfarth Shaw LLP/Qualcomm

(57) ABSTRACT

An integrated circuit (IC) is described. The IC includes a first die having a first semiconductor layer, a first active device layer and a first back-end-of-line (BEOL) layer. The IC also includes a second die having a second semiconductor layer, a second active device layer and a second back-end-of-line (BEOL) layer, and on the first die. The IC further includes a through substrate via (TSV) extending through the first die and the second die.

20 Claims, 27 Drawing Sheets

SINGLE-STEP VIA-LAST PROCESS FOR MULTI-STACK WAFERS

BACKGROUND

Field

Aspects of the present disclosure relate to semiconductor devices and, more particularly, to a single-step via-last process for multi-stack wafers.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has increased due to the considerable number of devices that are now interconnected in a modern electronic device. The increased number of interconnect levels for supporting the increased number of devices involves more intricate processes.

The design of complex system-on-chips (SoCs) may be affected by through progressive substrate via (TSV) volume deterioration as etching of TSV through multi-stack wafers. That is, the performance of complex SoCs may be detrimentally affected by cross-tier interconnect connections using through substrate vias in multi-stack wafers. Three-dimensional (3D) integration circuit design techniques that address TSV volume loss in cross-tier interconnect connections of multi-stack wafers are desired.

SUMMARY

An integrated circuit (IC) is described. The IC includes a first die having a first semiconductor layer, a first active device layer and a first back-end-of-line (BEOL) layer. The IC also includes a second die having a second semiconductor layer, a second active device layer and a second back-end-of-line (BEOL) layer, and on the first die. The IC further includes a through substrate via (TSV) extending through the first die and the second die.

A method for fabricating stacked integrated circuit (IC) dies is described. The method includes forming a first die having a first semiconductor layer, a first active device layer and a first back-end-of-line (BEOL) layer. The method also includes forming a second die having a second semiconductor layer, a second active device layer and a second back-end-of-line (BEOL) layer. The method further includes stacking the first die on the second die. The method also includes forming a through substrate via (TSV) extending through the first die and the second die.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
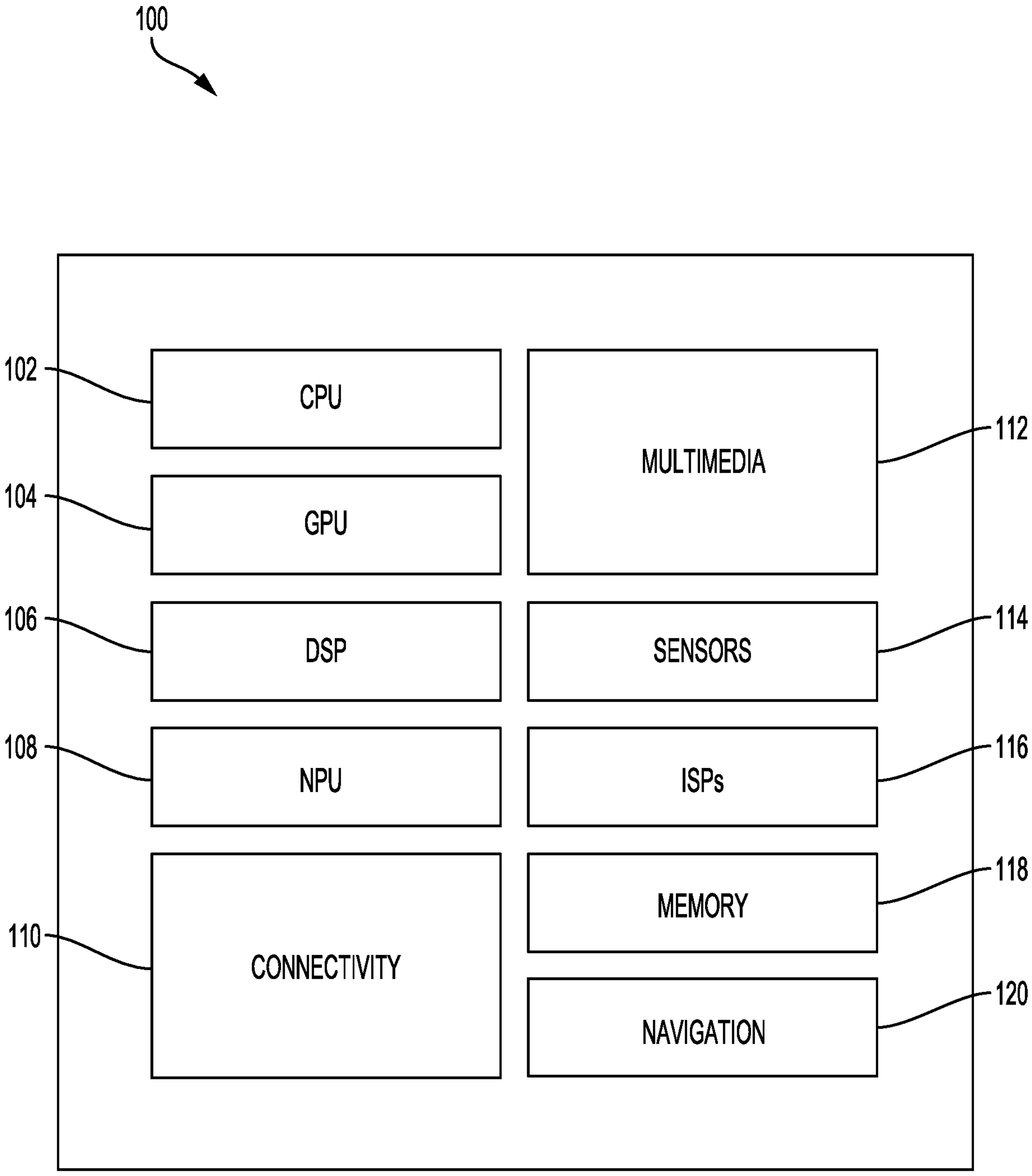
FIG. 1 illustrates an example implementation of a system-on-chip (SoC), including stacked integrated circuit (IC) dies, having a via-last through substrate via to provide cross-tier interconnect connections, in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

A system hierarchy includes interconnection of active devices at a lowest system level all the way up to system level interconnections at a highest level. Electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has increased due to the substantial number of devices that are now interconnected in a modern electronic device.

These interconnections include back-end-of-line (BEOL) interconnect layers, which may refer to the conductive interconnect layers (e.g., a first BEOL interconnect layer or metal one (M1), metal two (M2), metal three (M3), metal four (M4), etc.) for electrically coupling to front-end-of-line active devices of an integrated circuit. The various BEOL interconnect layers are formed at corresponding back-end-of-line interconnect levels, in which lower BEOL interconnect levels use thinner metal layers relative to upper BEOL interconnect levels. The BEOL interconnect layers may electrically couple to middle-of-line interconnect layers such as zero vias (V0) and zero-metal (M0) interconnect layers, for example, to connect M1 to an oxide diffusion (OD) layer of an integrated circuit.

Three-dimensional (3D) integration involves a multi-wafer (e.g., N>2) stacking capability, especially for enabling high-capacity memory (e.g., dynamic random-access memory (DRAM)). In practice, via-middle/first through substrate via (TSV) technology for supporting multi-wafer stacking involves a co-development of advanced processes with the via-middle/first TSV process. This co-development leads to years (e.g., 1-1.5 years) of delay in the technology introduction. Additionally, the use of via-middle/first TSV processes for multi-wafer 3D stacking is expensive due to subsequent wafer thinning, TSV reveal, and backside landing processes specified per each stacked wafer. In particular, the design of complex system-on-chips (SoCs) may be affected by TSV volume deterioration in multi-stack wafers formed using via-middle/first TSV processes.

By contrast, via-last TSV technology enables separation of the 3D stacking process from a wafer processing flow and provides the flexibility of utilizing a wafer technology without TSVs, which allows for multi-sourcing of wafers. Unfortunately, subsequent thinning and via-last processing is costly, poses alignment risks, and prohibits reduced z-height specifications. Additionally, the performance and complexity of SoCs may be detrimentally affected by cross-tier interconnect connections using TSVs in multi-stack wafers due to the noted volume deterioration. 3D integration circuit design techniques that address TSV volume loss in cross-tier interconnect connections of multi-stack wafers are desired.

Various aspects of the present disclosure provide stacked integrated circuit (IC) dies, having via-last through substrate vias (TSVs) to provide cross-tier interconnect connections. A process flow for fabrication of IC dies having via-last TSVs may include front-end-of-line (FEOL) processes, middle-of-line (MOL) processes, and BEOL processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

According to aspects of the present disclosure, stacked integrated circuit (IC) dies are fabricated using via-last through substrate vias (TSVs) to provide cross-tier interconnect connections. Various aspects of the present disclosure support stacking of TSV-less wafers followed by a via-last etch and TSV metallization after all wafers are stacked. These aspects of the present disclosure involve a straight TSV profile that provides a sufficient metal (e.g., copper (Cu)) volume at each layer of stacked IC dies. In various aspects of the present disclosure, the via-last TSVs provide cross-tier interconnect connections of the metallization layers across different layers and across wafers/dies.

FIG. 1 illustrates an example implementation of a host system-on-chip (SoC) 100, which includes stacked integrated circuit (IC) dies, having a via-last through substrate via to provide cross-tier interconnect connections, in accordance with aspects of the present disclosure. The host SoC 100 includes processing blocks tailored to specific functions, such as a connectivity block 110. The connectivity block 110 may include sixth generation (6G), connectivity fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multimedia engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
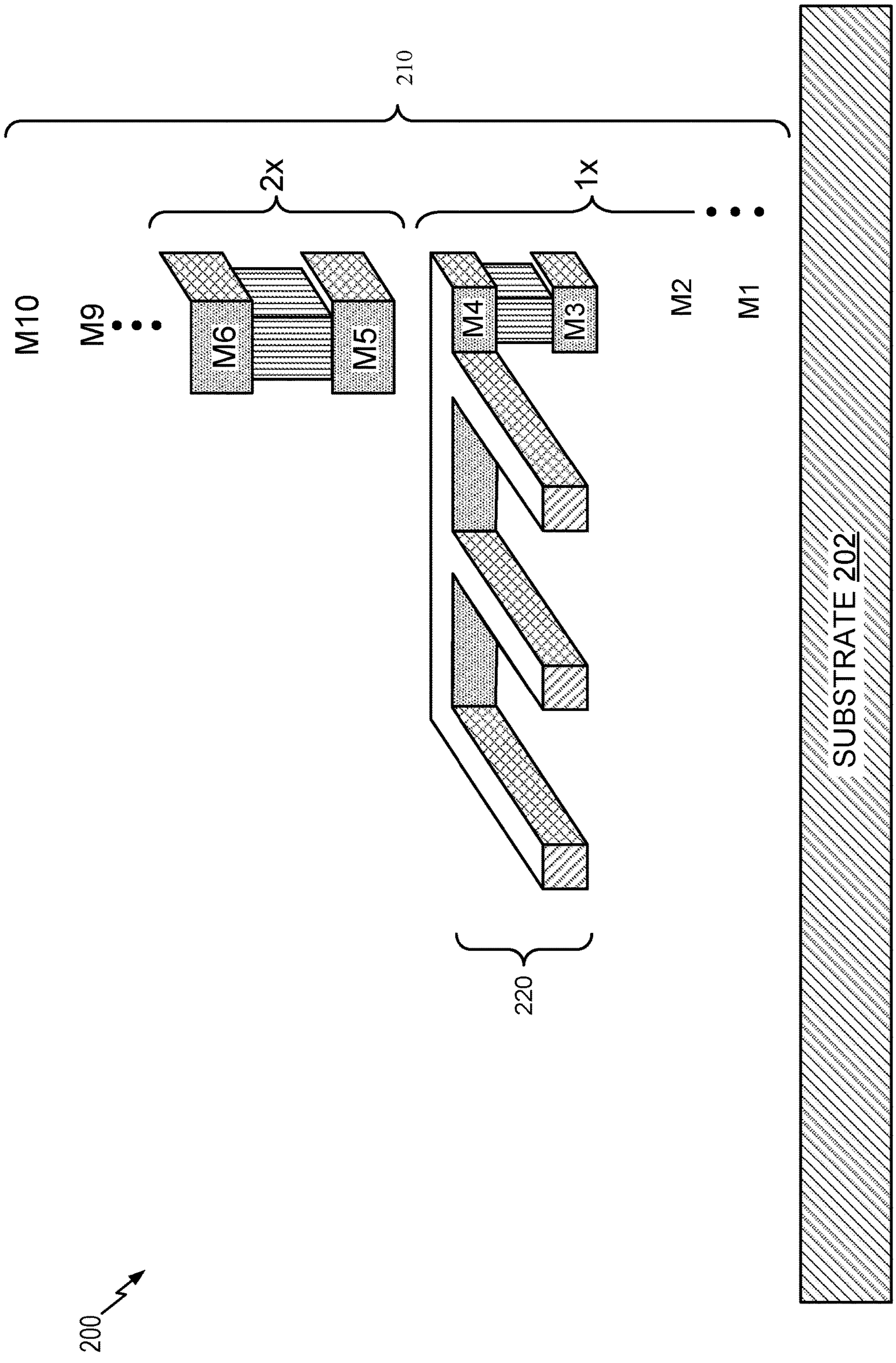
FIG. 2 is a block diagram illustrating a cross-section of an integrated circuit (IC) device including an interconnect stack of back-end-of-line (BEOL) layers.

FIG. 2 is a block diagram illustrating a cross-section of an integrated circuit (IC) device 200 including an interconnect stack 210. The interconnect stack 210 of the IC device 200 includes multiple back-end-of-line (BEOL) conductive interconnect layers (M1, . . . , M9, M10) on a semiconductor substrate 202 (e.g., a diced silicon wafer). The semiconductor substrate 202 may be fabricated to include an active device layer (not shown) using complementary metal oxide semiconductor (CMOS) technology. The various BEOL interconnect layers are formed at corresponding BEOL interconnect levels, in which lower BEOL interconnect levels (e.g., M1) use thinner metal layers relative to upper (e.g., M9) BEOL interconnect levels. In this example, an interconnect structure 220 is formed at an M4 interconnect layer, between M3 and M5 interconnect layers. Additionally, the BEOL interconnect layers may include middle-of-line interconnect layers such as zero vias (V0) and zero-metal (M0) interconnect layers, for example, to connect M1 to an oxide diffusion (OD) layer of the integrated substrate.

3D integration involves a multi-wafer (e.g., N>2) stacking capability, especially for enabling high-capacity memory (e.g., dynamic random-access memory (DRAM)). In practice, using via-middle/first through substrate via (TSV) technology for supporting multi-wafer stacking involves a co-development of advanced processes with the via-middle/first TSV process. This co-development leads to years (e.g., 1-1.5 years) of delay in introducing the technology. In particular, the use of via-middle/first TSV processes for multi-wafer 3D stacking is expensive due to subsequent wafer thinning, TSV reveal, and backside landing processes specified per each stacked wafer.

By contrast, via-last TSV technology enables separation of the 3D stacking process from a wafer processing flow and provides the flexibility of utilizing a wafer technology without TSVs, which allows for multi-sourcing of wafers. Unfortunately, subsequent thinning and via-last processing is costly, poses alignment risks, and prohibits reduced z-height design specifications. Additionally, the performance and complexity of SoCs may be detrimentally affected by cross-tier interconnect connections using TSVs in multi-stack wafers due to the noted volume deterioration. Various aspects of the present disclosure are directed to 3D integration circuit design technique that address TSV volume loss in cross-tier interconnect connection of multi-stack wafers, for example, as shown in FIG. 3.

Figure 3:
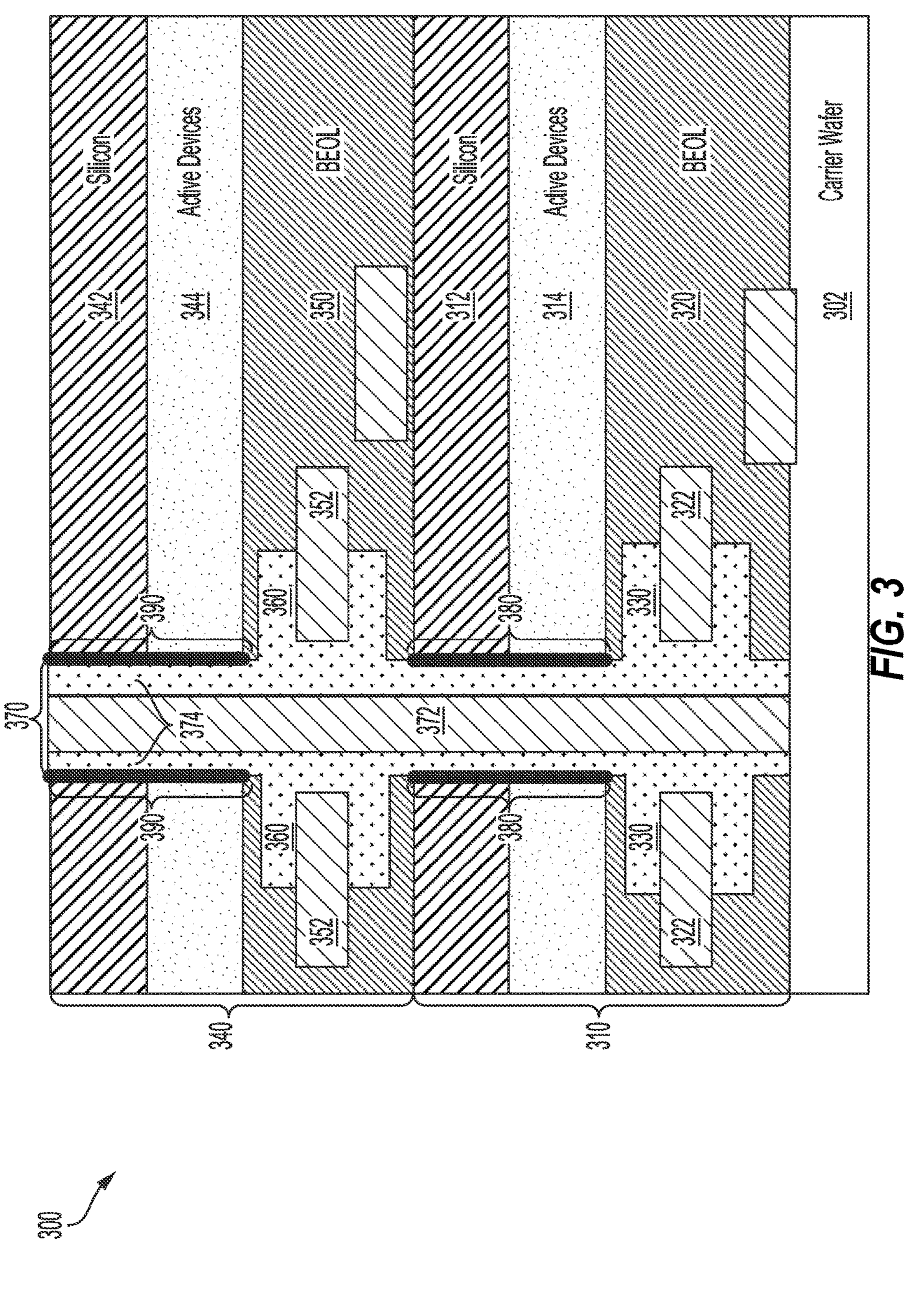
FIG. 3 shows a cross-sectional view illustrating stacked integrated circuit (IC) dies, having a via-last through substrate via to provide cross-tier interconnect connections, according to various aspects of the present disclosure.

FIG. 3 shows a cross-sectional view illustrating stacked integrated circuit (IC) dies, having a via-last through substrate via to provide cross-tier interconnect connections, according to various aspects of the present disclosure. As shown in FIG. 3, an IC device 300 includes a first die 310 having a first semiconductor layer 312, a first active device layer 314, and a first back-end-of-line (BEOL) layer 320, supported by a carrier wafer 302. Additionally, the IC device 300 includes a second die 340, having a second semiconductor layer 342, a second active device layer 344, and a second back-end-of-line (BEOL) layer 350. As described, a stacked die refers to a final structure that is singulated from the final stacked wafers after processing is completed at wafer-level.

In this example, the second die 340 is stacked on the first die 310. Alternatively, the first BEOL layer 320 of the of the first die 310 is coupled to the second semiconductor layer 342 of the second die 340 to stack the first die 310 on the second die 340. In this alternative configuration, a through substrate via (TSV) 370 extends from and through the first semiconductor layer 312 of the second die 340 to and through the second BEOL layer 350 of the second die 340. Although the IC device 300 is shown with the carrier wafer 302, it should be recognized that the carrier wafer 302 may be removed following the TSV formation.

In various aspects of the present disclosure, the IC device 300 includes the TSV 370 extending through the second die 340 and the first die 310 and stopping on the carrier wafer 302. As shown in FIG. 3, the second BEOL layer 350 includes a second wrap-around contact 360 coupled to the TSV 370 and coupled to second interconnects 352 of the second BEOL layer 350. Additionally, the first BEOL layer 320 includes a first wrap-around contact 330 coupled to the TSV 370 and coupled to first interconnects 322 of the first BEOL layer 320. Beneficially, the first wrap-around contact 330 and the second wrap-around contact 360 to a landing layer of the TSV 370 provide an improved voltage-drop. In this example, the first die 310 includes first dielectric liners 380 separating the TSV 370 from the first semiconductor layer 312 and the first active device layer 314 of the first die 310. Additionally, the second die 340 includes second dielectric liners 390 separating the TSV 370 from the second semiconductor layer 342 and the second active device layer 344 of the second die 340.

In various aspects of the present disclosure, the TSV 370 is formed as a single straight via through the first die 310 and the second die 340 by maintaining a diameter of the TSV 370 extending through the second semiconductor layer 342 of the second die 340 equal to a diameter of the TSV 370 extending through the first BEOL layer 320 of first die 310. Formation of the TSV 370 as a single straight via using a single step via-last process allows the TSV 370 to provide cross-tier BEOL interconnect connection without volume loss. Additionally, the formation of the TSV 370 as a single straight via using the single step via-last process avoids the use of dedicated masks per each wafer/die stack to account for changes of the BEOL interconnect layers across stacked wafers/dies. That is, a same metal mask is used per each stack tier of the IC device 300 as part of a single step etch, which enables a single metallization scheme for all ties of the IC device.

In various aspects of the present disclosure, the TSV 370 is composed of a multilayer conductive material, including a TSV core 372 and a TSV outer layer 374. For example, the TSV core 372 may be composed of an electroplated conductive material (e.g., electroplated copper (Cu)). Additionally, the TSV outer layer 374 may be composed of a conformally deposited (e.g., physical vapor deposition (PVD), chemical vapor deposition (CVD), or atomic layer deposition (ALD)) conductive material (e.g., aluminum (Al), cobalt (Co), ruthenium (Ru), or tungsten (W)). In various aspects of the present disclosure, the conformally deposited conductive material of the TSV outer layer 374 is selected to improve a contact interface with the first wrap-around contact 330 and the second wrap-around contact 360.

FIGS. 4A-4H are block diagrams illustrating formation of the IC device 300, including the stacked integrated circuit (IC) dies of FIG. 3, according to various aspects of the present disclosure.

Figure 4A:
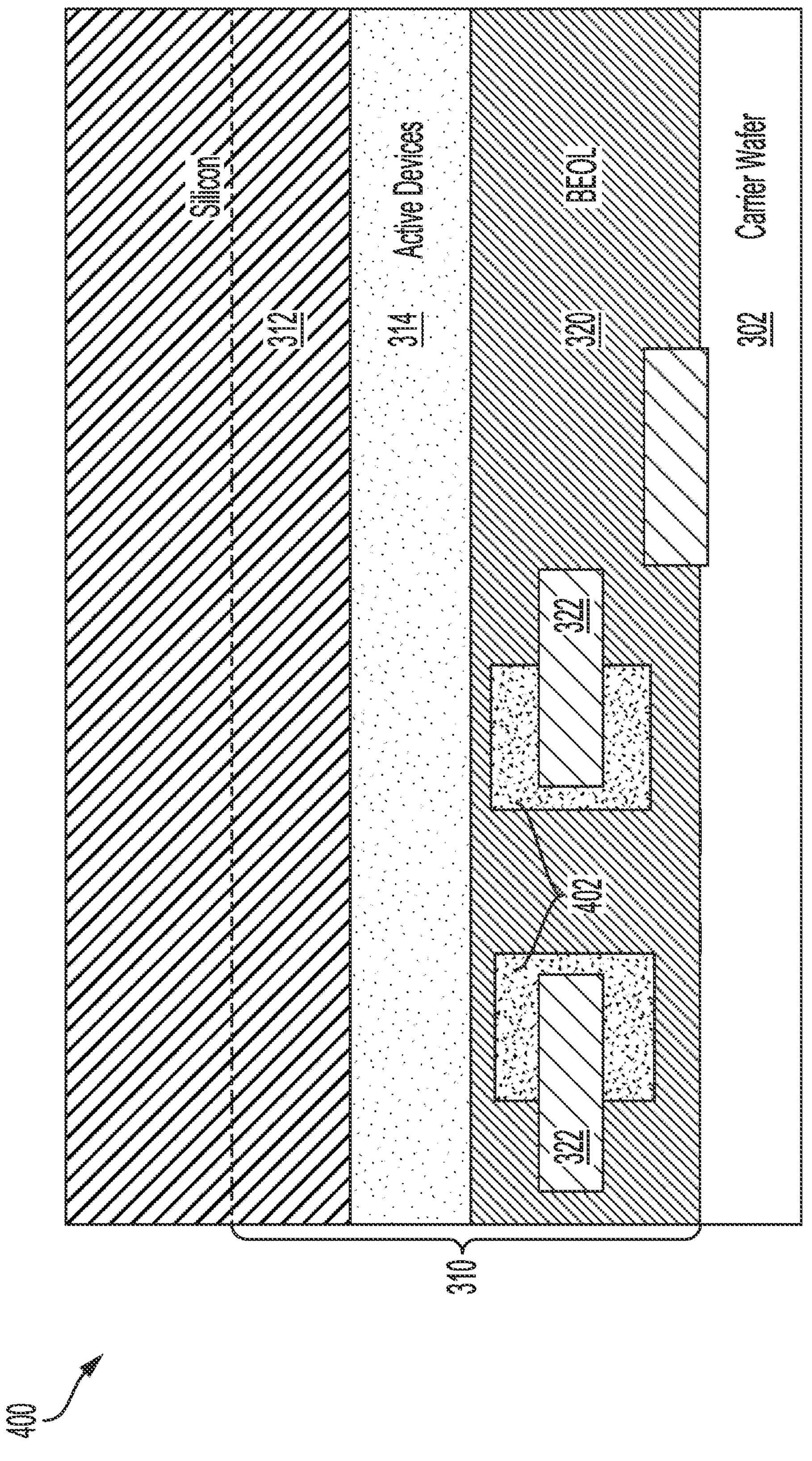
FIGS. 4A-4H are block diagrams illustrating formation of the stacked integrated circuit (IC) dies of FIG. 3, according to various aspects of the present disclosure.

As shown in FIG. 4A, an IC device fabrication process begins at step 400, in which a lithographic etch is performed, followed by a deposition of a first sacrificial dielectric material 402 on the first interconnects 322 of the first BEOL layer 320 of the first die 310. The first sacrificial dielectric material 402 may be deposited using a spin-on process. In various aspects of the present disclosure, the first interconnects 322 of the first BEOL layer 320 are formed using a dual-damascene process with the first sacrificial dielectric material 402. Additionally, the first die 310 is bonded to the carrier wafer 302.

Figure 4B:
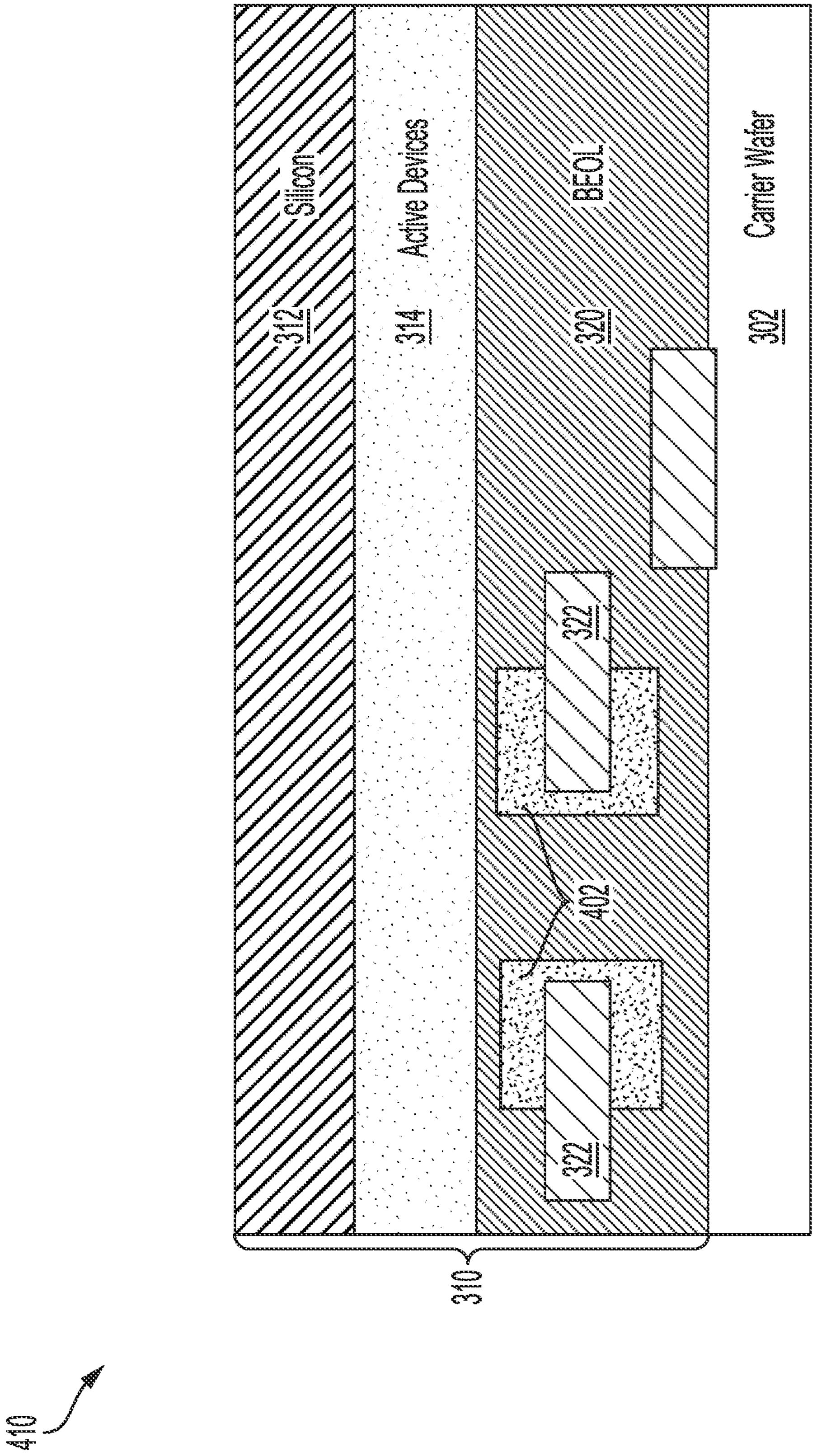

As shown in FIG. 4B, at step 410, the first semiconductor layer 312 is subjected to a grinding process, followed by a chemical mechanical polishing (CMP) process, and completed with a wet etch process to thin the first semiconductor layer 312 to a predetermined thickness (e.g., 2-3 microns). In this example, thinning of the first semiconductor layer 312 to the predetermined thickness completes formation of the first die 310.

Figure 4C:
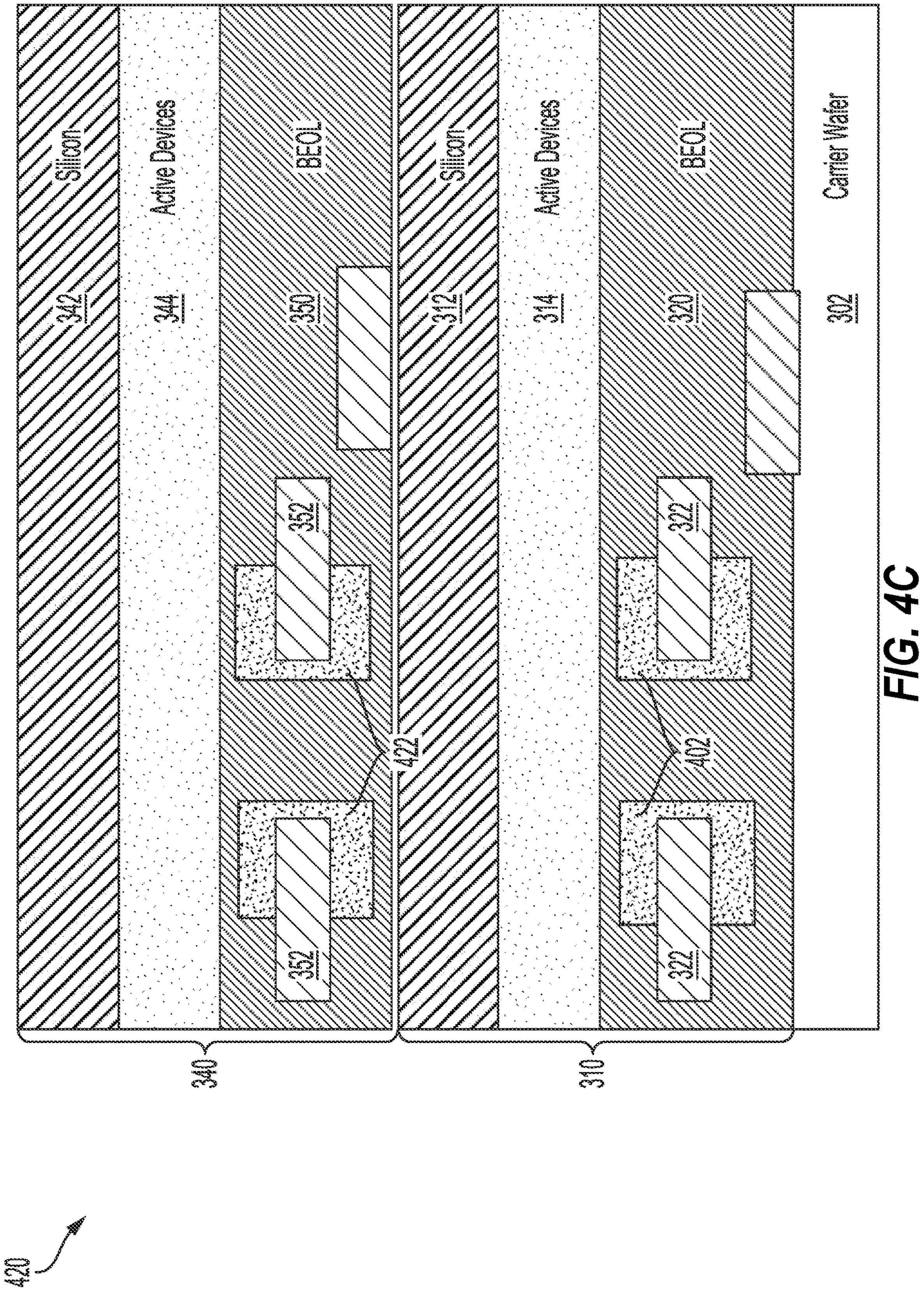

As shown in FIG. 4C, at step 420, the second die 340, including a second sacrificial dielectric material 422, is stacked on the first die 310. Additionally, the second die 340 and the first die 310 are further thinned to the predetermined thickness. In various aspects of the present disclosure, the first die 310 is bonded to the second die 340 using an oxide/dielectric bond.

Figure 4D:
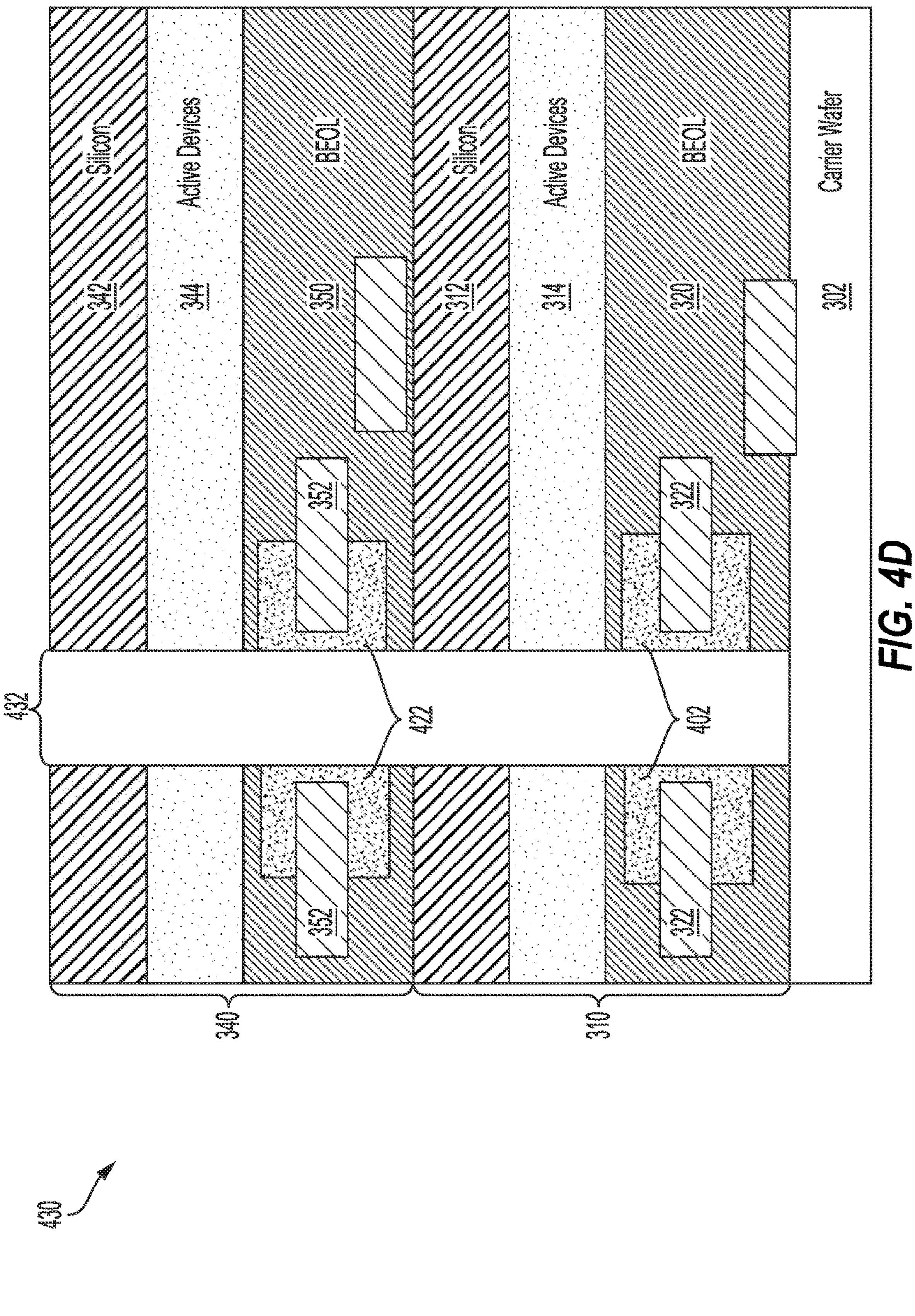

As shown in FIG. 4D, at step 430, a selective etch is performed through the second die 340 and the first die 310, using the carrier wafer 302 as etch stop layer. The selective etch is performed through the second die 340 and the first die 310 to form a TSV opening 432 for the TSV 370 with a potentially high aspect ratio (e.g., AR=10), for example, as shown in FIG. 3.

Figure 4E:
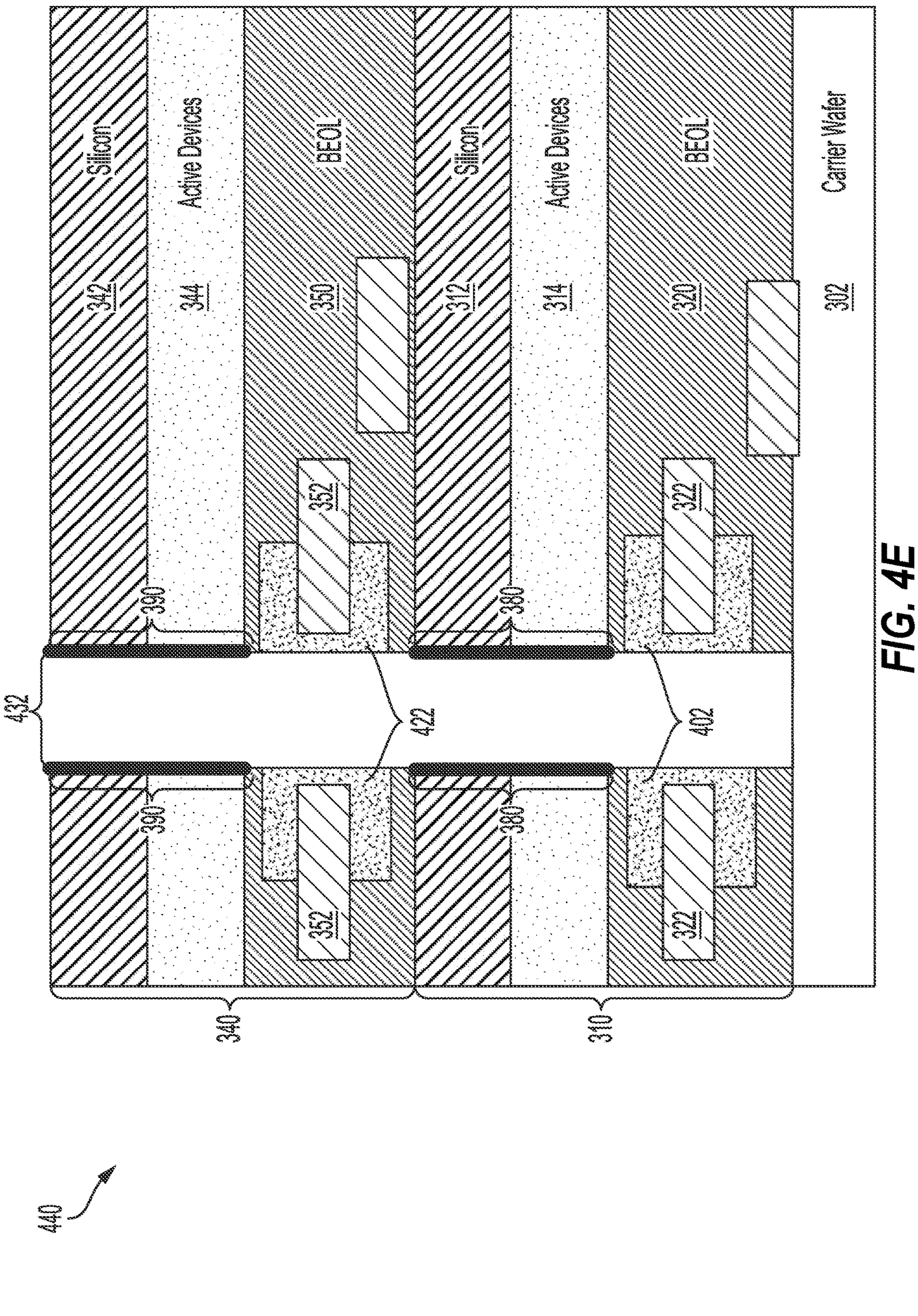

As shown in FIG. 4E, at step 440, a semiconductor selective dielectric liner is deposited in the TSV opening 432. The deposition of the semiconductor selective dielectric liner forms the first dielectric liners 380 separating the TSV opening 432 from the first semiconductor layer 312 and the first active device layer 314 of the first die 310. Additionally, deposition of the semiconductor selective dielectric liner forms the second dielectric liners 390 separating the TSV opening 432 from the second semiconductor layer 342 and the second active device layer 344 of the second die 340. In some aspects of the present disclosure, the first dielectric liners 380 and the second dielectric liners 390 are formed by an oxidation and anneal process on exposed sidewalls of the first semiconductor layer 312 and the first active device layer 314 of the first die 310 and the second semiconductor layer 342 and the second active device layer 344 of the second die 340.

Figure 4F:
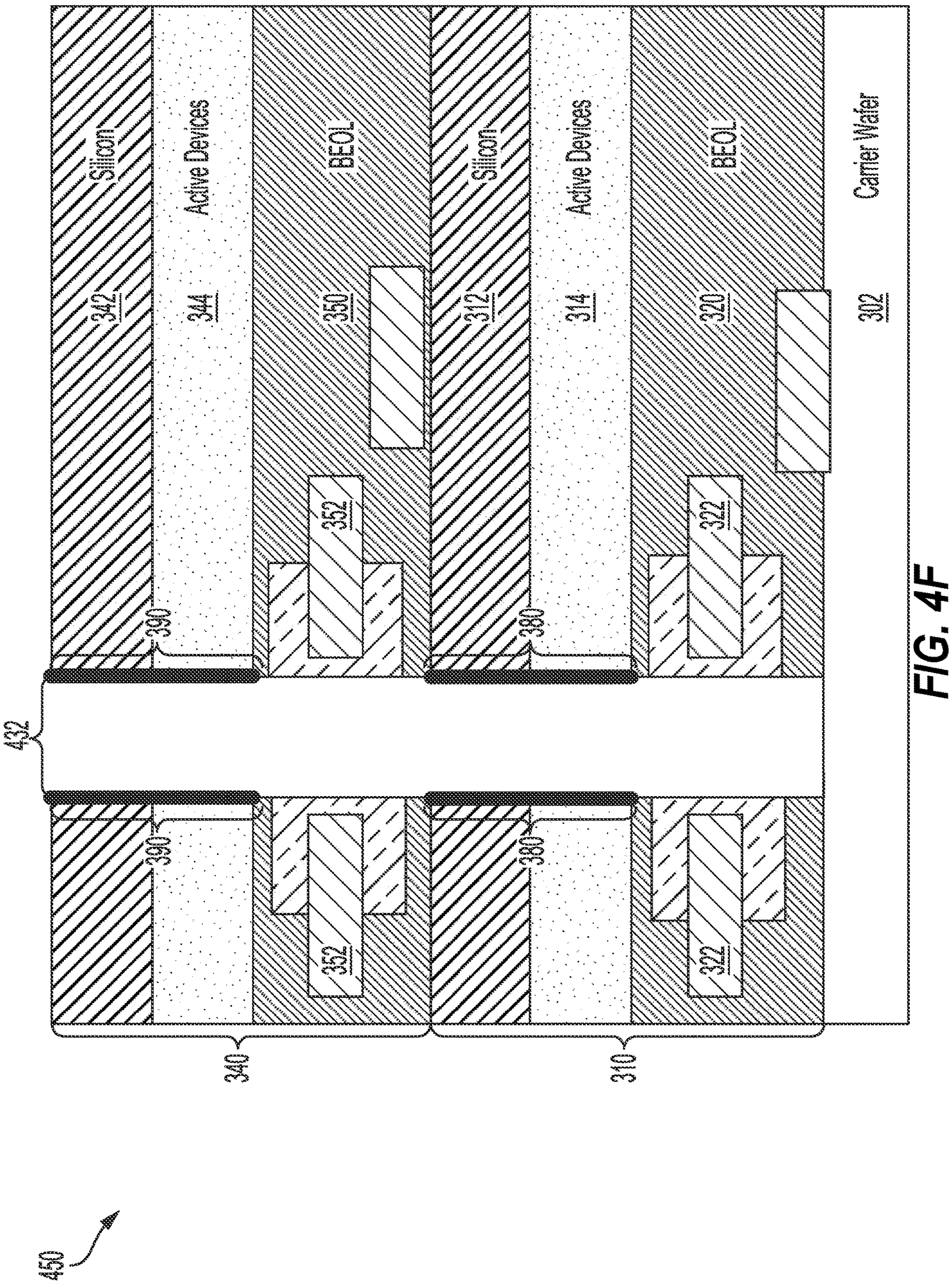

As shown in FIG. 4F, at step 450, the first sacrificial dielectric material 402 and the second sacrificial dielectric material 422 are removed. Removal of the first sacrificial dielectric material 402 and the second sacrificial dielectric material 422 exposes the first interconnects 322 of the first BEOL layer 320 and the second interconnects 352 of the second BEOL layer 350.

Figure 4G:
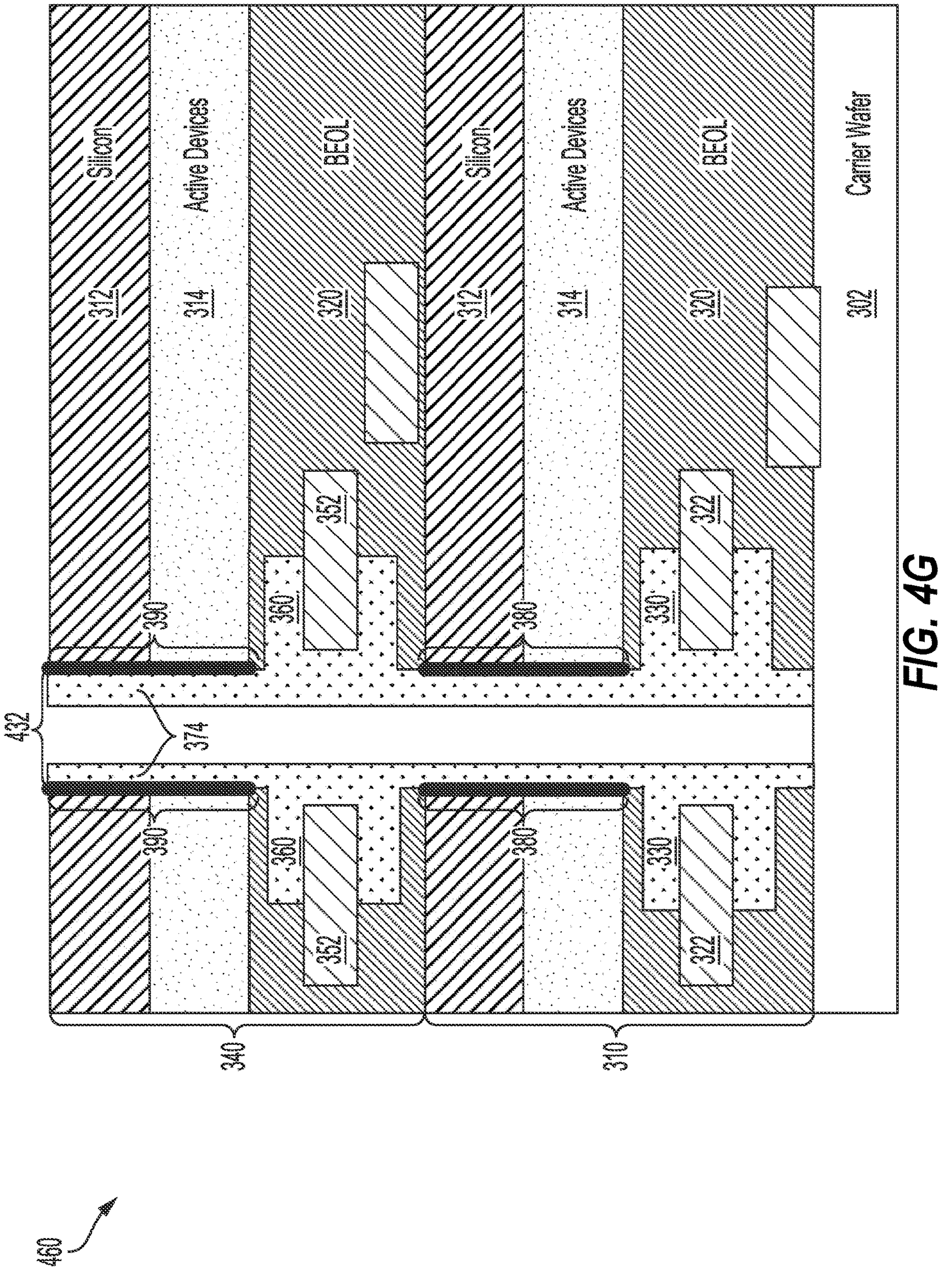

As shown in FIG. 4G, at step 470, the TSV outer layer 374 is formed by conformally depositing a conductive material on outer walls of the TSV opening 432 as well as gaps along the TSV opening 432. For example, the conformal deposition of the conductive material (e.g., aluminum (Al), cobalt (Co), ruthenium (Ru), or tungsten (W)) is performed using physical vapor deposition (PVD), chemical vapor deposition (CVD), atomic layer deposition (ALD), or other like conformal deposition process. In this example, formation of the TSV outer layer 374 also forms the first wrap-around contact 330 and the second wrap-around contact 360. In various aspects of the present disclosure, the conformally deposited conductive material of the TSV outer layer 374 is selected to improve a contact interface with the first wrap-around contact 330 and the second wrap-around contact 360.

Figure 4H:
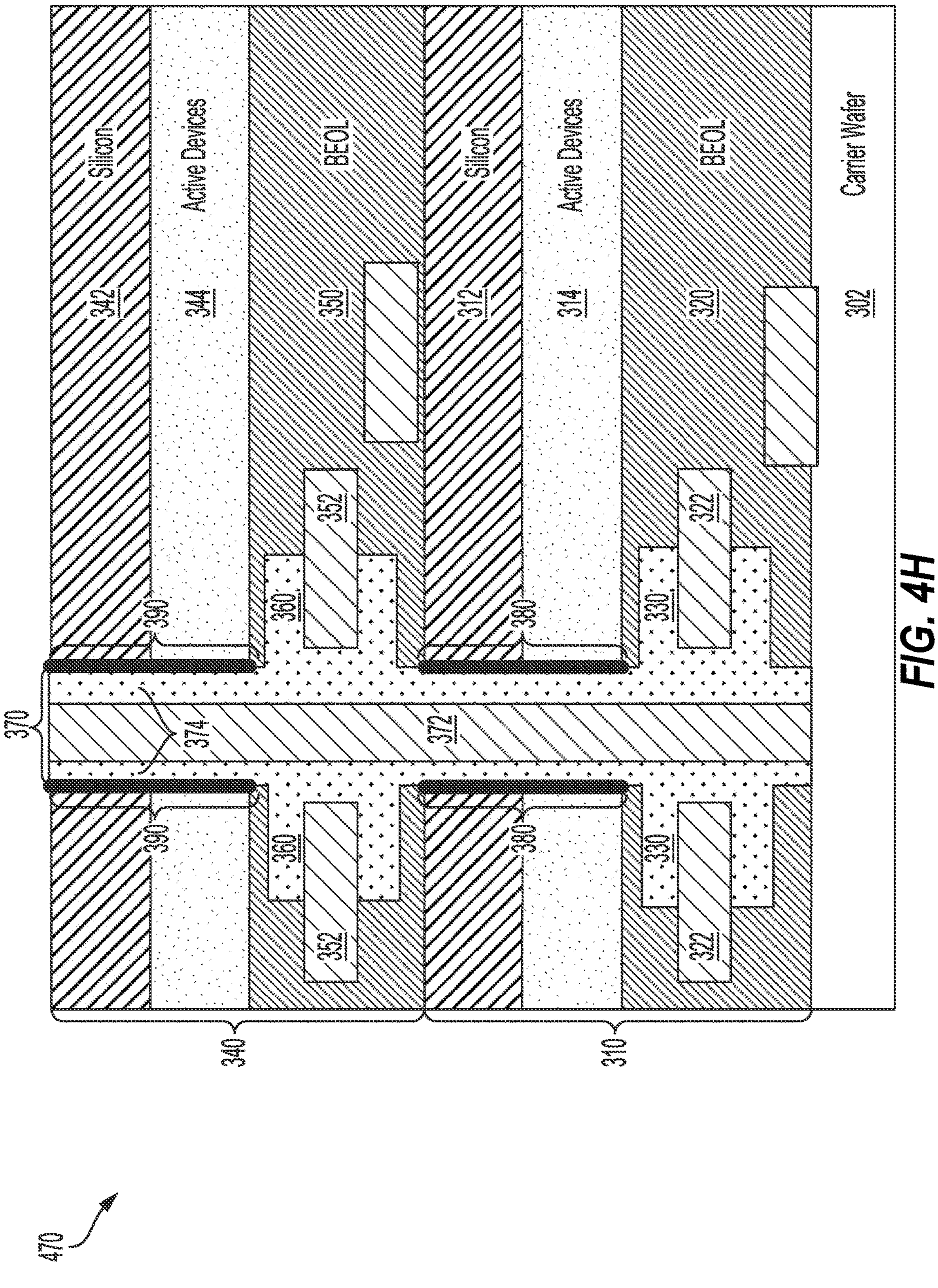

As shown in FIG. 4H, at step 470, a recess etch (e.g., trim) of the TSV outer layer 374 is performed. Once the recess etch is completed, an electroplating process of a conductive material (e.g., electroplated copper (Cu)) is performed on the TSV outer layer 374 to form the TSV core 372 of the TSV 370. This process is completed by singulating the stacked wafers into dies after all wafer-level processing steps. In various aspects of the present disclosure, the TSV 370 is composed of a multilayer conductive material, including the TSV core 372 and the TSV outer layer 374 to complete formation of the IC device 300, as shown in FIG. 3.

Figure 5:
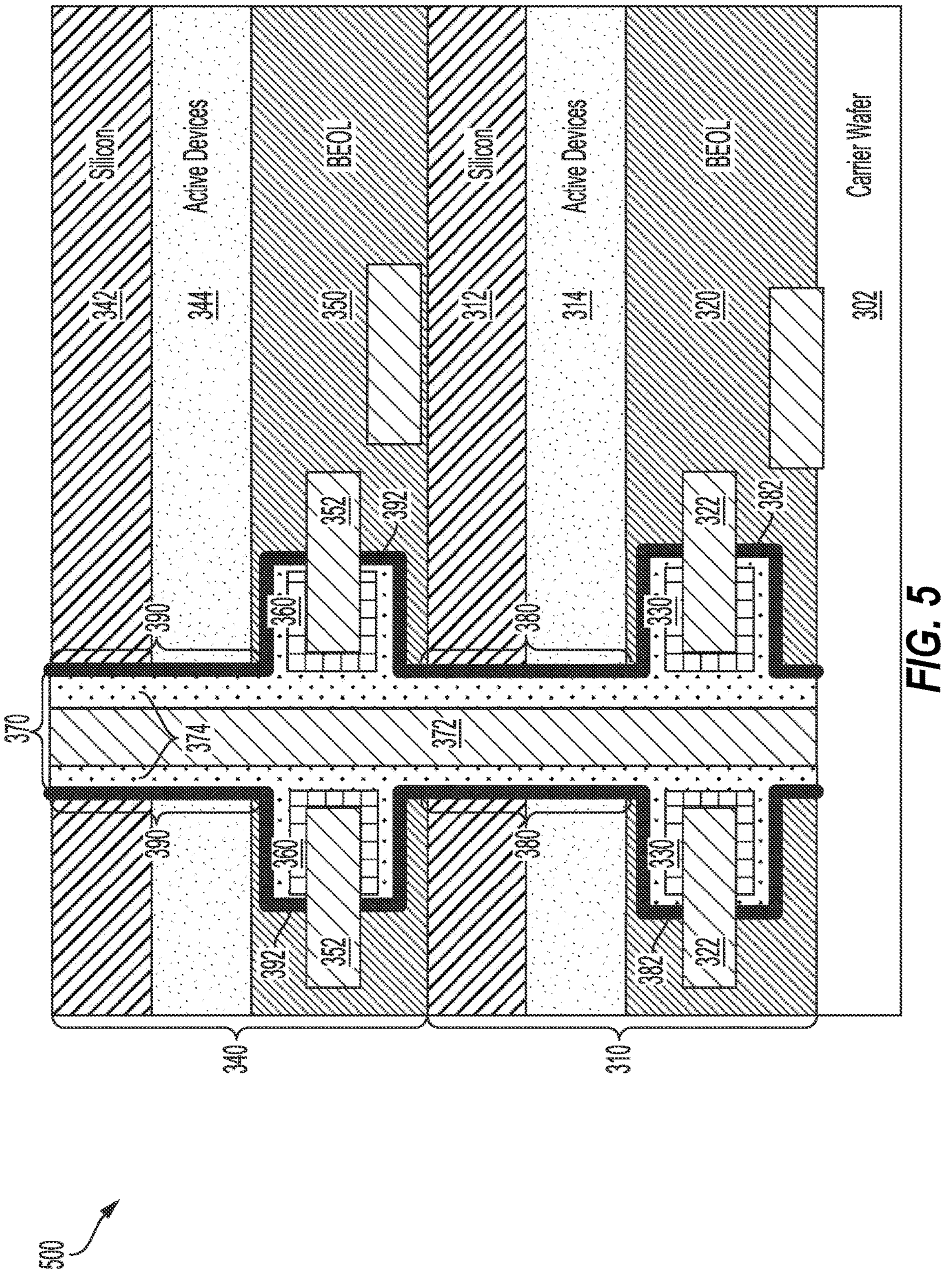
FIG. 5 shows a cross-sectional view illustrating stacked integrated circuit (IC) dies, having a via-last through substrate via to provide cross-tier interconnect connections, according to various further aspects of the present disclosure.

FIG. 5 shows a cross-sectional view illustrating stacked integrated circuit (IC) dies, having a via-last through substrate via to provide cross-tier interconnect connections, according to various further aspects of the present disclosure. In FIG. 5 an IC device 500 includes the first die 310 having the first semiconductor layer 312, the first active device layer 314, and the first BEOL layer 320, supported by the carrier wafer 302. Additionally, the IC device 500 includes the second die 340, having the second semiconductor layer 342, the second active device layer 344, and the second BEOL layer 350. In this example, the second die 340 is stacked on the first die 310.

In various aspects of the present disclosure, the IC device 500 is similar to the IC device 300 of FIG. 3 and is described using similar reference numbers. The IC device 500 also includes the TSV 370 extending through the second die 340 and the first die 310, and stopping on the carrier wafer 302, as well as the second wrap-around contact 360 and the first wrap-around contact 330. In this example, the first die 310 also includes the first dielectric liners 380 separating the TSV 370 from the first semiconductor layer 312 and the first active device layer 314 of the first die 310. Additionally, the second die 340 includes the second dielectric liners 390 separating the TSV 370 from the second semiconductor layer 342 and the second active device layer 344 of the second die 340. In this alternative configuration, the second wrap-around contact 360 includes an extension 392 of the second dielectric liners 390 on the second wrap-around contact 360. Additionally, the first wrap-around contact 330 includes an extension 382 of the first dielectric liners 380 on the first wrap-around contact 330.

FIGS. 6A-6F are cross-sectional diagrams illustrating formation of the stacked integrated circuit (IC) dies of FIG. 5, according to various aspects of the present disclosure.

Figure 6A:
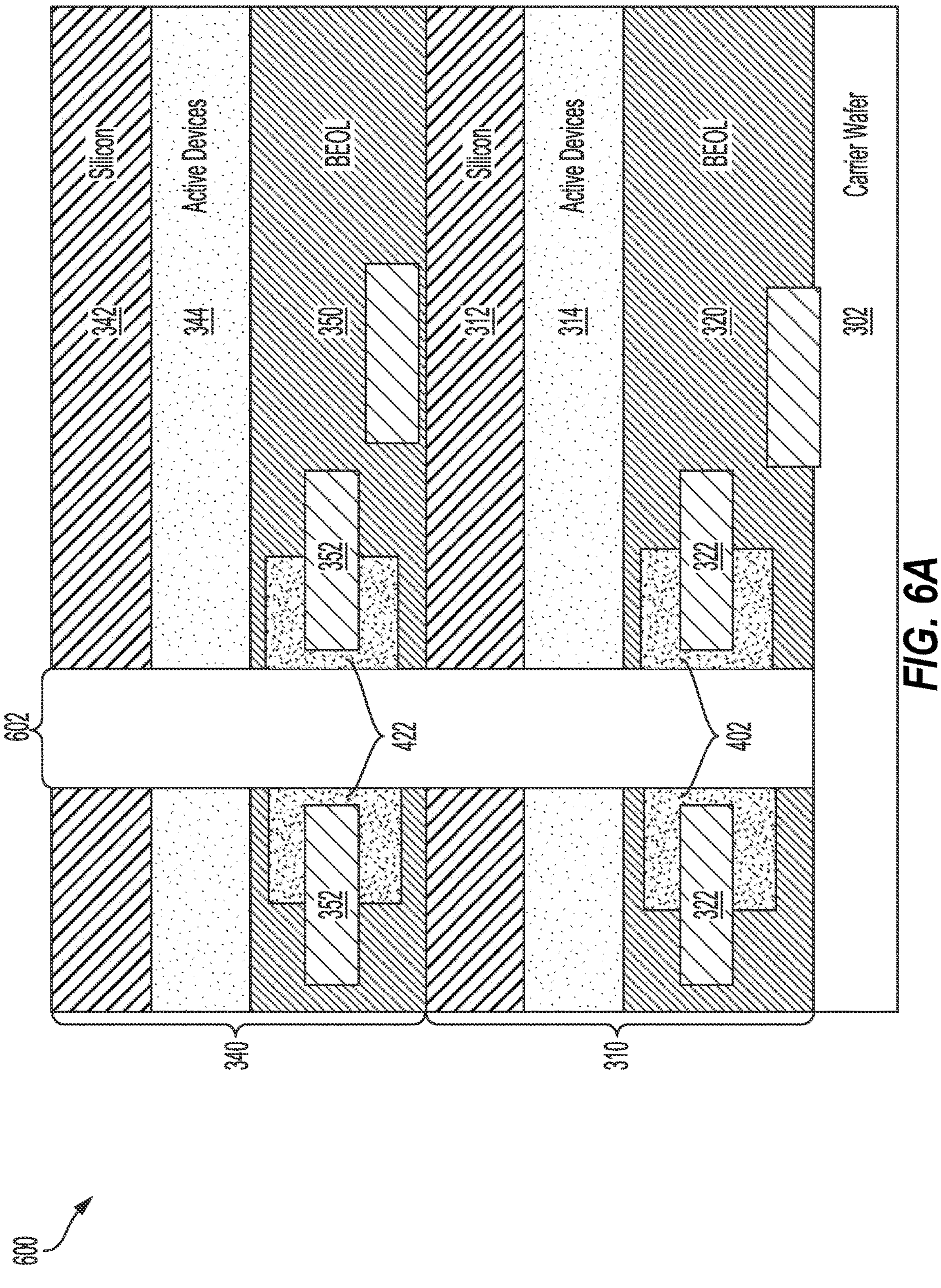
FIGS. 6A-6F are cross-sectional diagrams illustrating formation of the stacked integrated circuit (IC) dies of FIG. 5, according to various aspects of the present disclosure.

As shown in FIG. 6A, an IC device fabrication process begins at step 600, in which a selective etch is performed through the second die 340 and the first die 310, using the carrier wafer 302 as etch stop layer. The selective etch is performed through the second die 340 and the first die 310 to form a TSV opening 602 for the TSV 370, for example, as shown in FIG. 5.

Figure 6B:
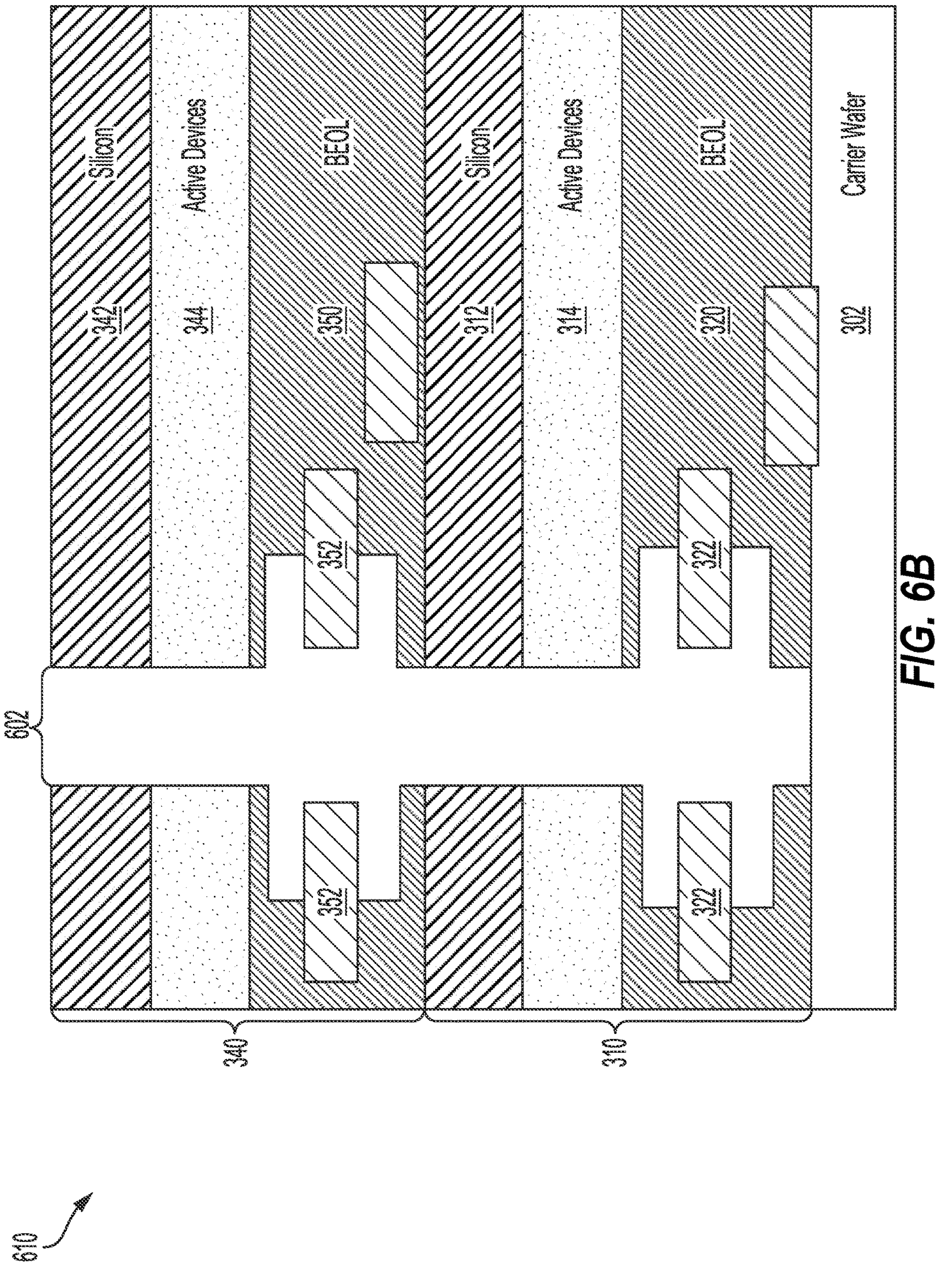

As shown in FIG. 6B, at step 610, the first sacrificial dielectric material 402 and the second sacrificial dielectric material 422 are removed. Removal of the first sacrificial dielectric material 402 and the second sacrificial dielectric material 422 exposes the first interconnects 322 of the first BEOL layer 320 and the second interconnects 352 of the second BEOL layer 350.

Figure 6C:
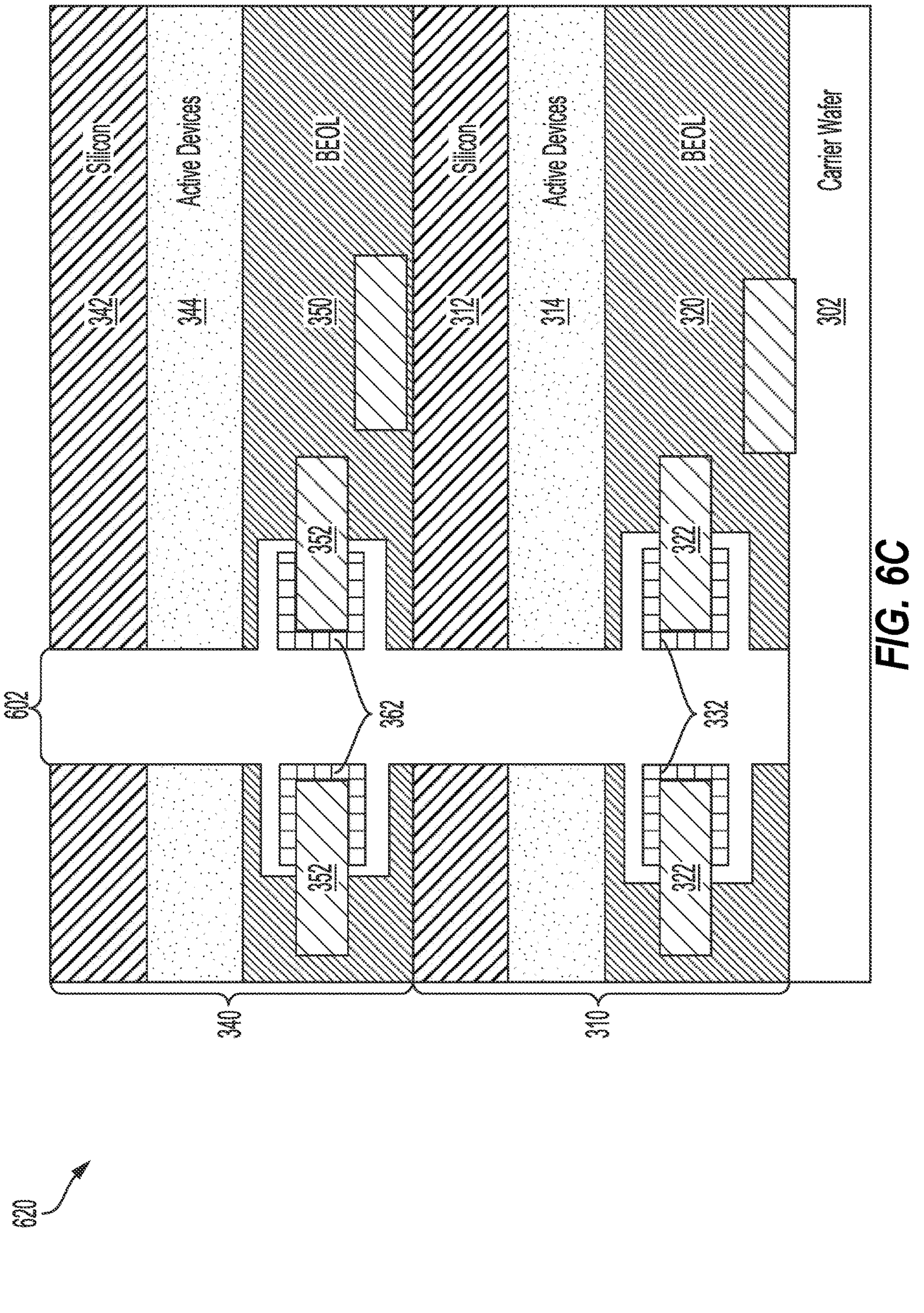

As shown in FIG. 6C, at step 620, a first self-assembled monolayer (SAM) 332 is formed on the first interconnects 322 of the first BEOL layer 320 in order to functionalize the surface of the first interconnects 322, and a second SAM 362 is formed on the second interconnects 352 of the second BEOL layer 350 in order to functionalize the surface of the second interconnects 352.

Figure 6D:
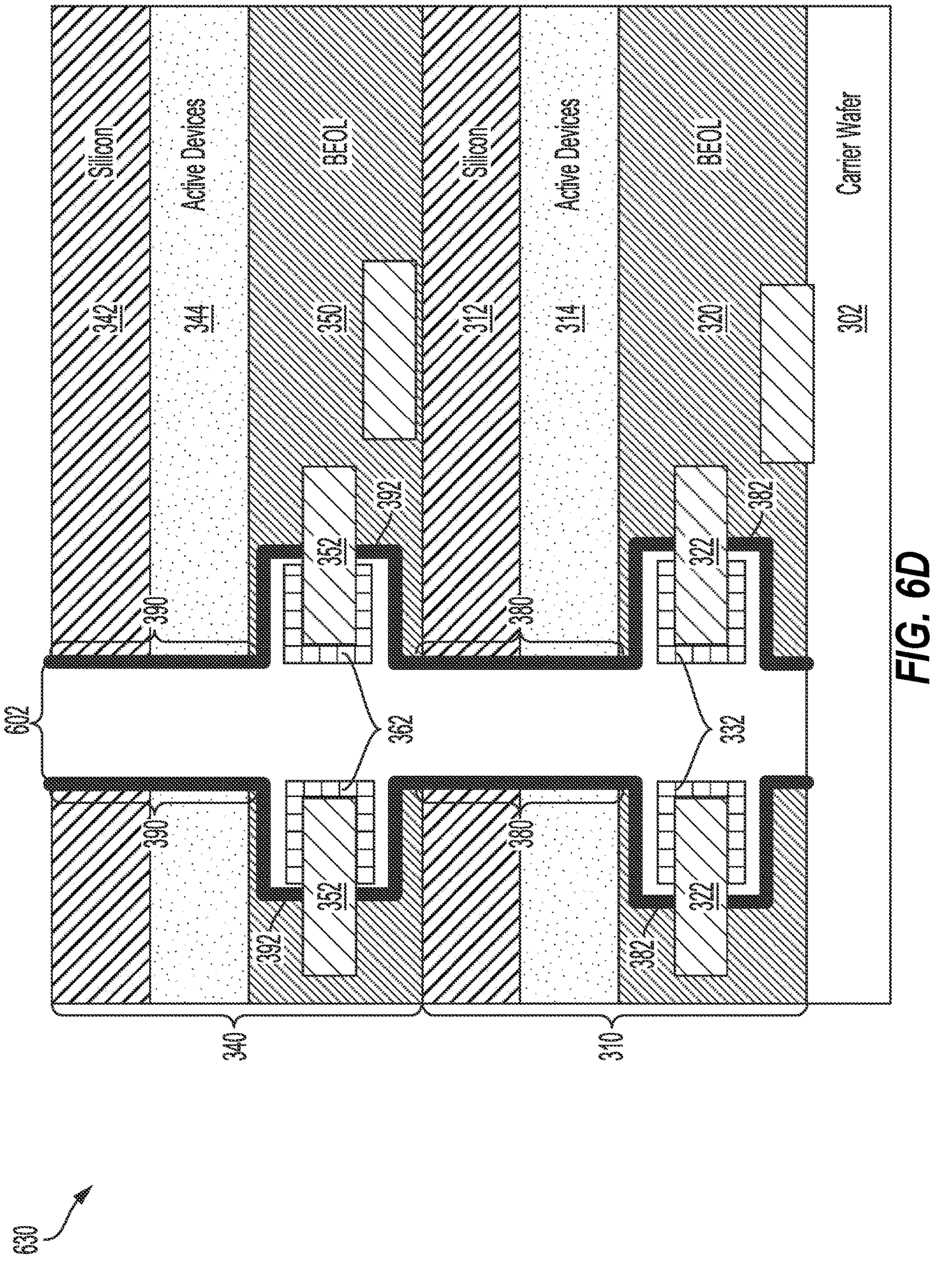

As shown in FIG. 6D, at step 630, a deposition of a barrier layer, a liner, and a seed layer is performed within the TSV opening 602 on exposed sidewalls as well as the first SAM 332 and the second SAM 362. For example, the barrier and liner layers are conformally deposited with low growth on the metal layers of the first SAM 332 and the second SAM 362. Subsequently, a trim-etch process is performed to trim the dielectric liner from the first SAM 332 and the second SAM 362. This process forms the first dielectric liners 380 and the second dielectric liners 390. In this alternative configuration, the second wrap-around contact 360 includes an extension 392 of the second dielectric liners 390 on the second wrap-around contact 360. Additionally, the first wrap-around contact 330 includes the extension 382 of the first dielectric liners 380 on the first wrap-around contact 330.

Figure 6E:
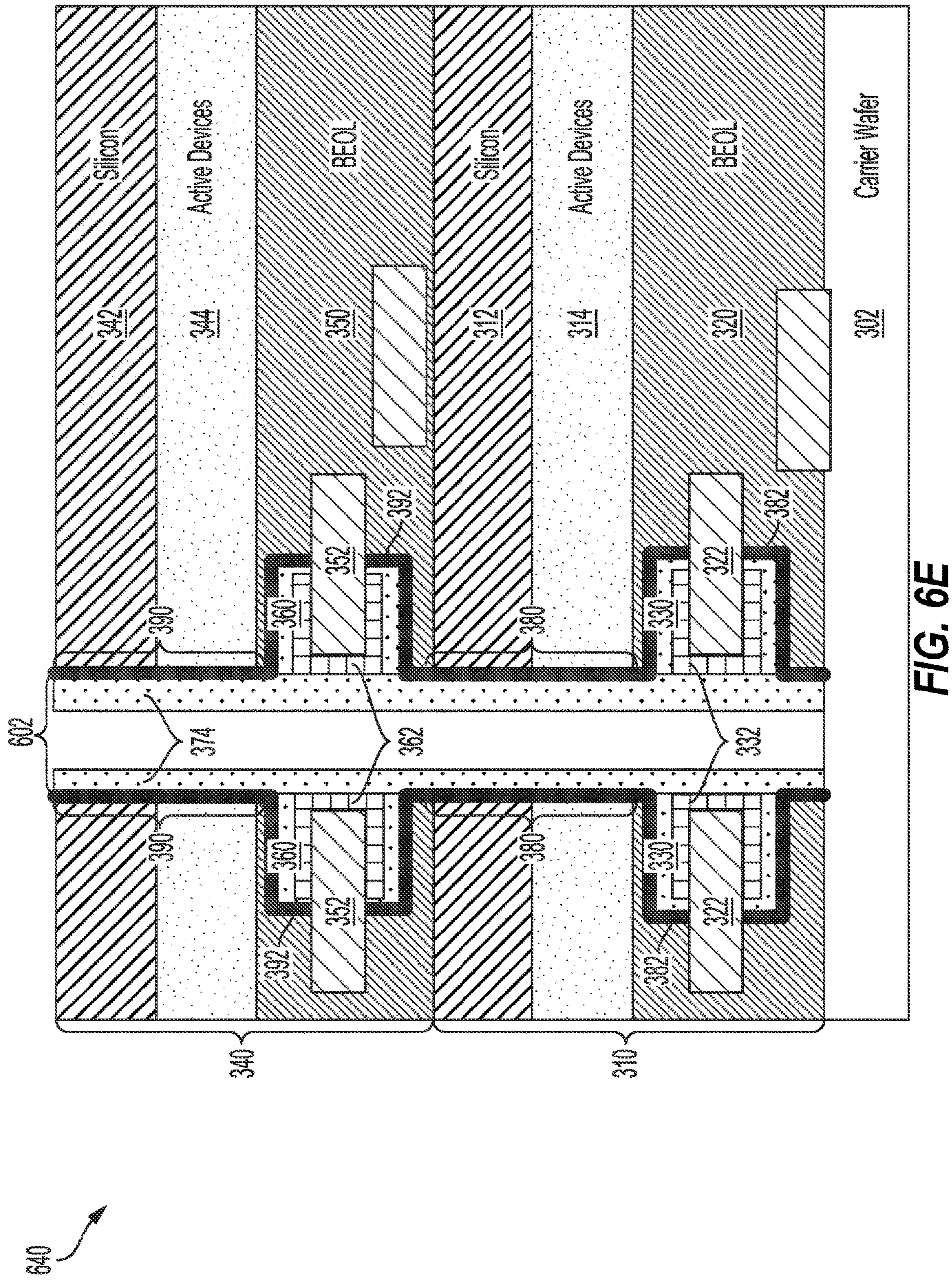

As shown in FIG. 6E, at step 640, the TSV outer layer 374 is formed by conformally depositing a conductive material on outer walls of the TSV opening 602 as well as gaps along the TSV opening 602. For example, the conformal deposition of the conductive material (e.g., aluminum (Al), cobalt (Co), ruthenium (Ru), or tungsten (W)) is performed using physical vapor deposition (PVD), chemical vapor deposition (CVD), atomic layer deposition (ALD), or other like conformal deposition process. In this example, formation of the TSV outer layer 374 also forms the first wrap-around contact 330 and the second wrap-around contact 360. In various aspects of the present disclosure, the conformally deposited conductive material of the TSV outer layer 374 as well as the first SAM 332 and the second SAM 362 are selected to improve a contact interface with the first wrap-around contact 330 and the second wrap-around contact 360.

Figure 6F:
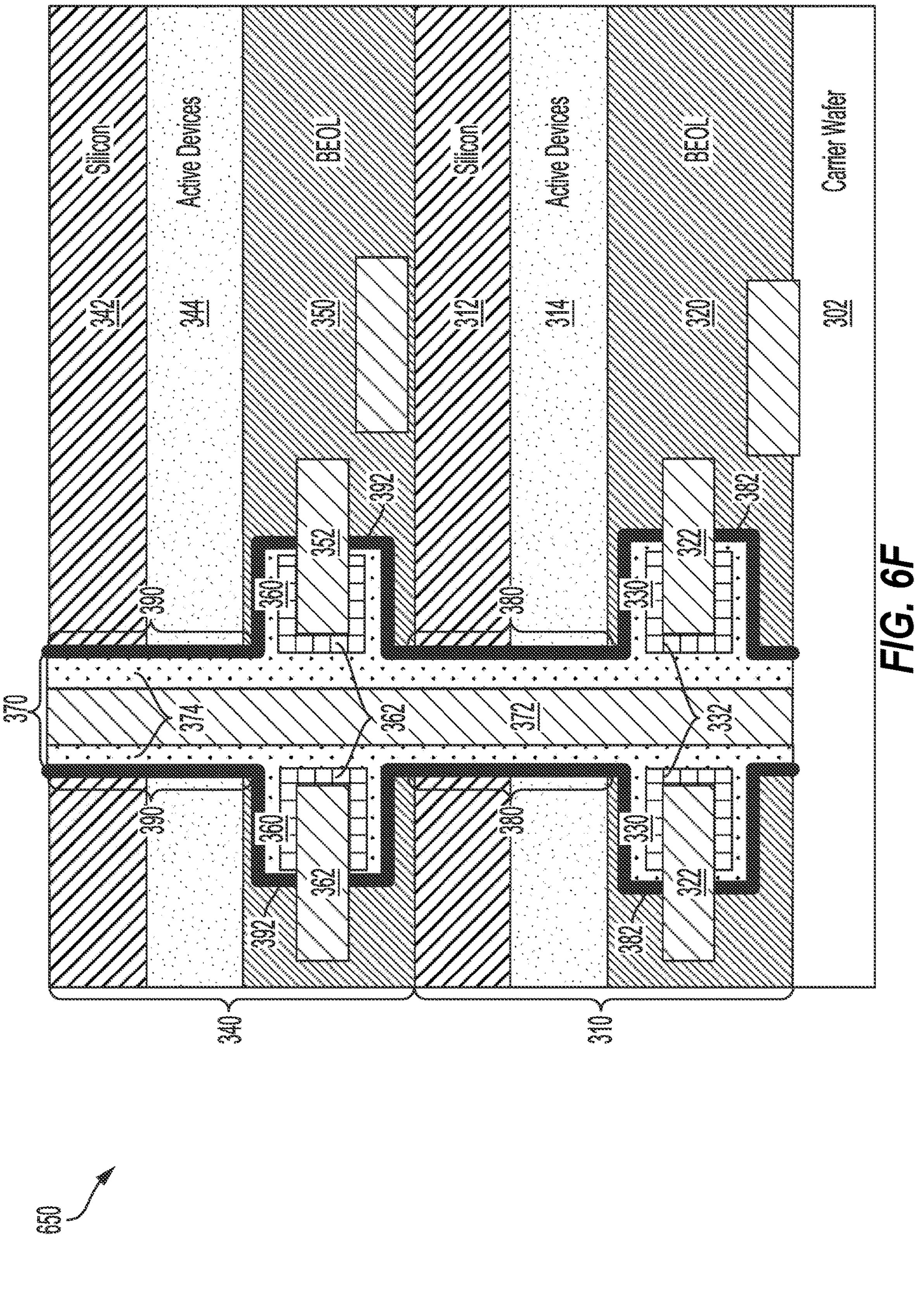

As shown in FIG. 6F, at step 650, a recess etch of the TSV outer layer 374 is performed. Once the recess etch is completed, an electroplating process of a conductive material (e.g., electroplated copper (Cu)) is performed on the TSV outer layer 374 to form the TSV core 372 of the TSV 370. In various aspects of the present disclosure, the TSV 370 is composed of a multilayer conductive material, including the TSV core 372 and the TSV outer layer 374 to complete formation of the IC device 500, as shown in FIG. 5. This process is completed by singulating the stacked wafers into dies after all wafer-level processing steps.

Figure 7A:
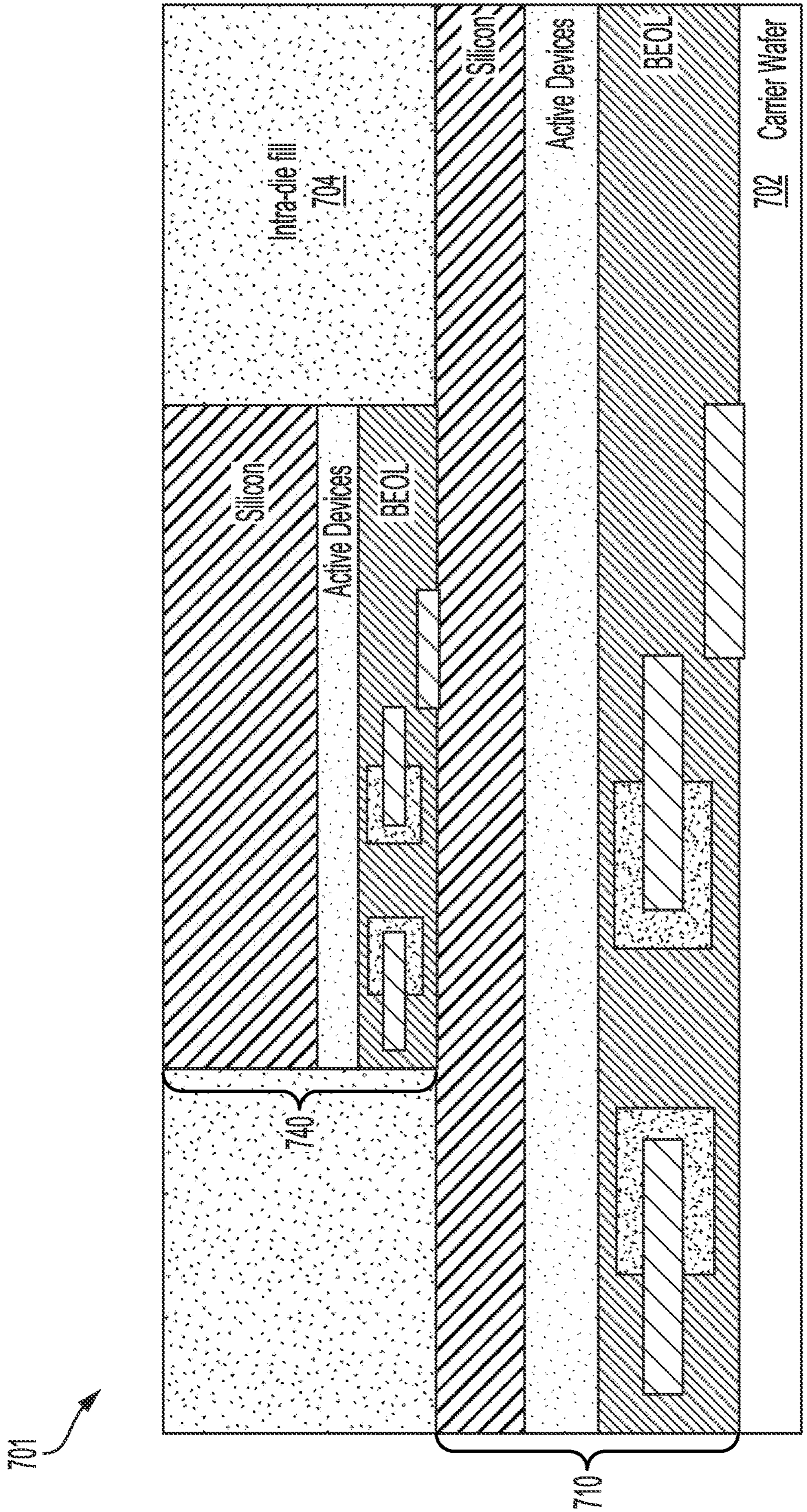
FIG. 7A-7D are cross-sectional diagrams illustrating a chip-on-wafer stacking flow for different die sizes having a via-last through substrate via to provide cross-tier interconnect connections, according to various aspects of the present disclosure.

FIG. 7A-7D are cross-sectional diagrams illustrating a chip-on-wafer or die-on-wafer stacking flow for different die sizes having a via-last through substrate via to provide cross-tier interconnect connections, according to various aspects of the present disclosure. As shown in FIG. 7A, at step 701, a first die 710 and a second die 740 are stacked on a carrier wafer 702. The first die 710, the second die 740 and the carrier wafer 702 may be partially thinned prior to stacking on the carrier wafer 702. In this example, a first intra-die film 704 (e.g., a molding compound) is deposited to fill intra-die gaps caused by varying size dimensions between the first die 710 and the second die 740.

Figure 7B:
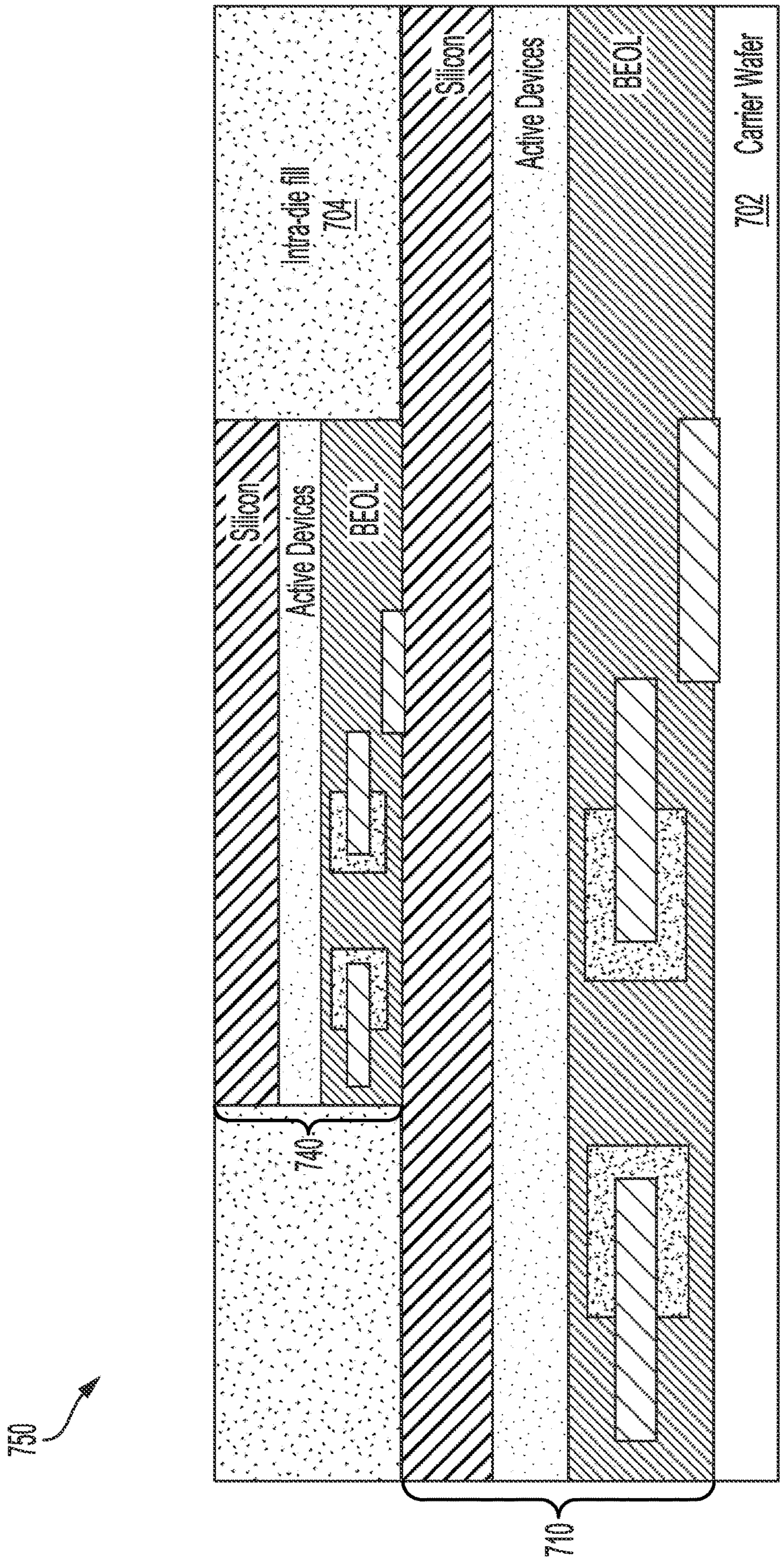
Figure 7C:
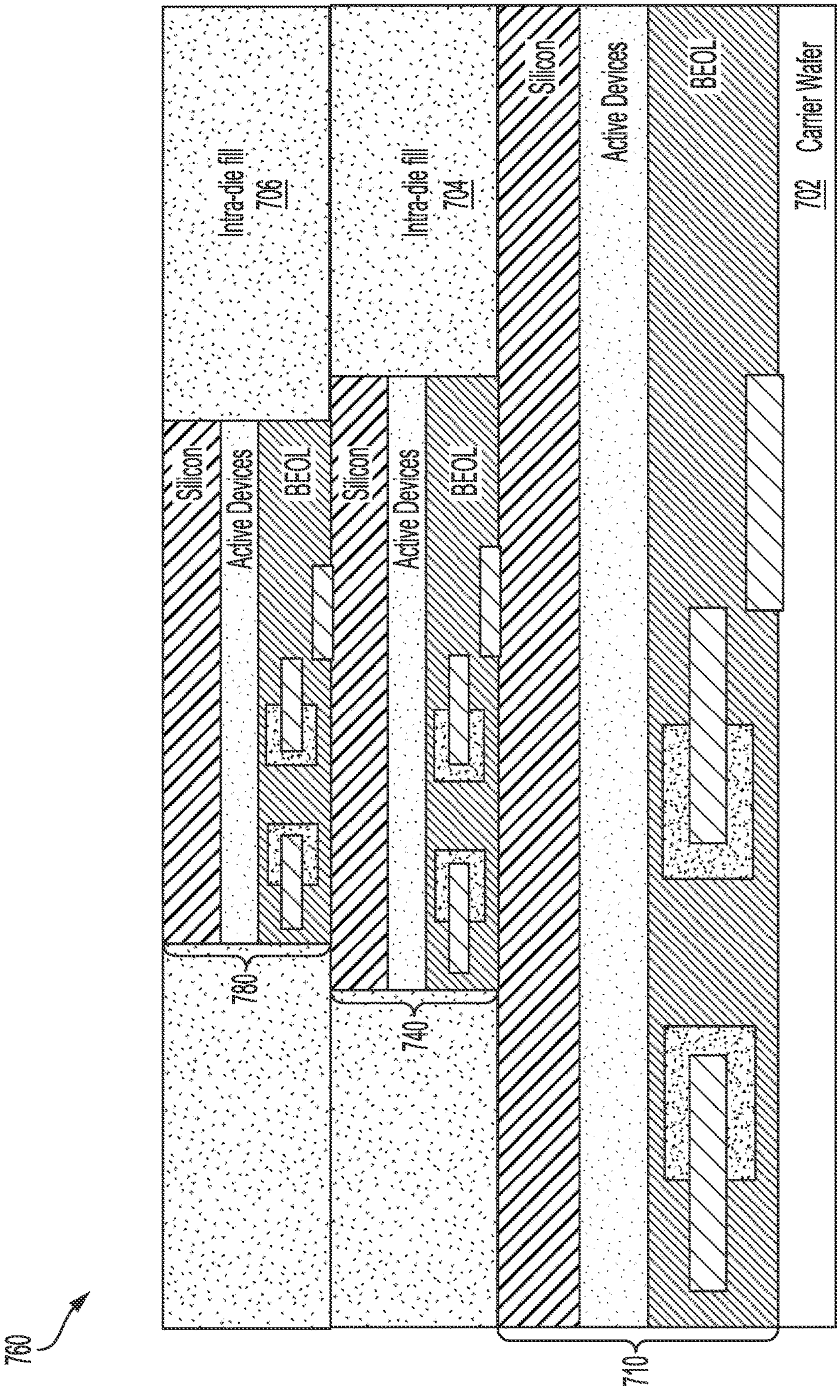

As shown in FIG. 7B, at step 750, the first die 710, the second die 740, and the carrier wafer 702 are further thinned. As shown in FIG. 7C, at step 760, a third die 780 is stacked on the second die 740. Additionally, a second intra-die film 706 is deposited to fill intra-die gaps caused by varying size dimensions between the second die 740 and the third die 780. In various aspects of the present disclosure, the first die 710, the second die 740, and the third die 780 are similar to the configurations shown in FIGS. 3 and 5.

Figure 7D:
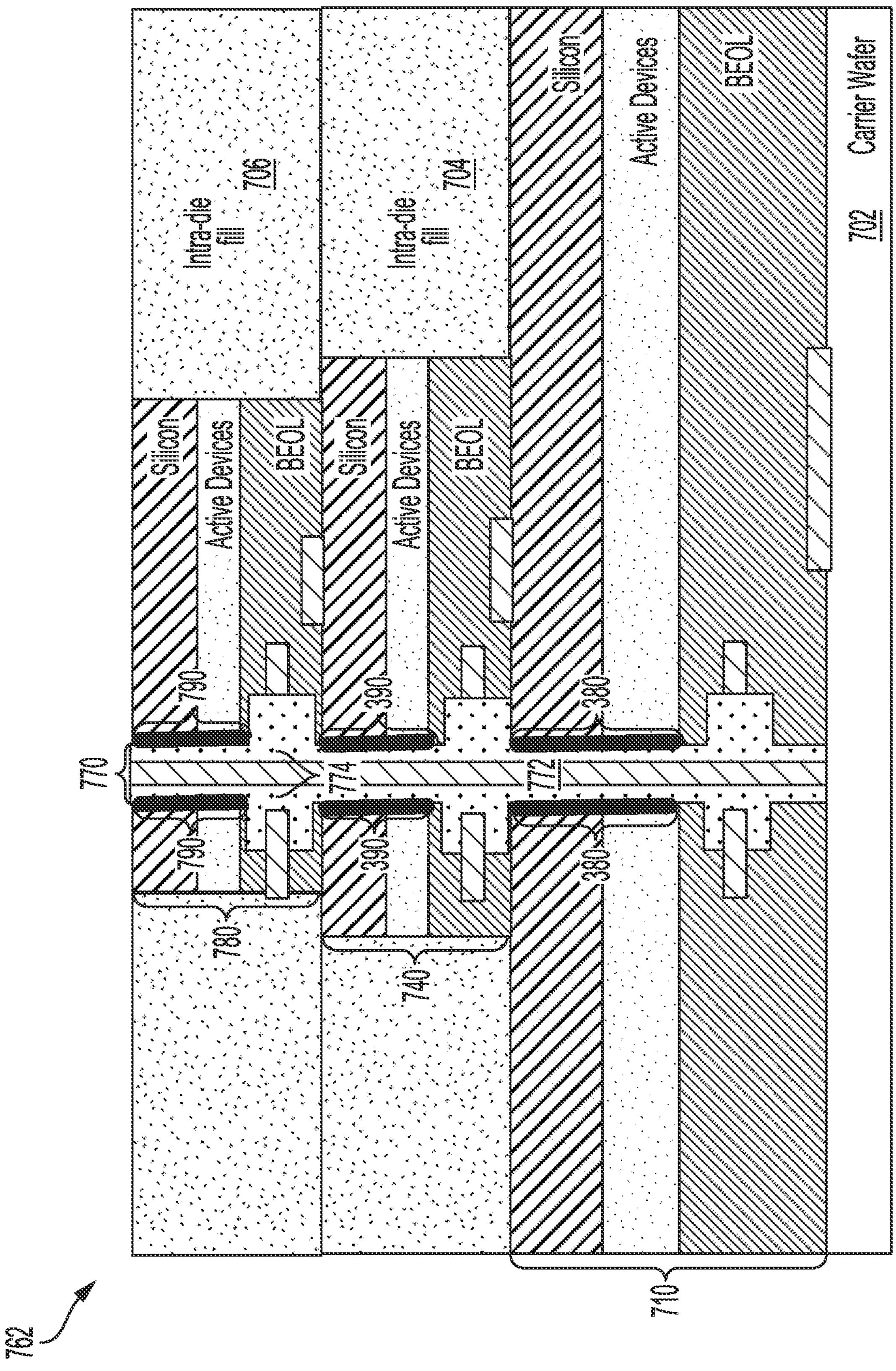

As shown in FIG. 7D, a TSV 770, including a TSV outer layer 774 and a TSV core 372, is formed through the third die 780, the second die 740, and the first die 710. In various aspects of the present disclosure, the TSV 370 is composed of a multilayer conductive material, including the TSV core 372 and the TSV outer layer 374 to complete formation of an IC device 700, having a via-last through substrate via to provide cross-tier interconnect connections, according to various aspects of the present disclosure. In this example, the first die 710 also includes the first dielectric liners 380 separating the TSV 770 from the first semiconductor layer and the first active device layer of the first die 710. Additionally, the second die 740 includes the second dielectric liners 390 separating the TSV 770 from the second semiconductor layer and the second active device layer of the second die 740. Similarly, the third die 780 includes third dielectric liners 790 separating the TSV 770 from a third second semiconductor layer and a third active device layer of the third die 780. This process is completed by singulating the stacked wafers into dies after all wafer-level processing steps. This chip-on wafer stacking flow may repeat to form multi-stacked integrated circuit (IC) dies, for example, as shown in FIGS. 8A and 8B.

Figure 8A:
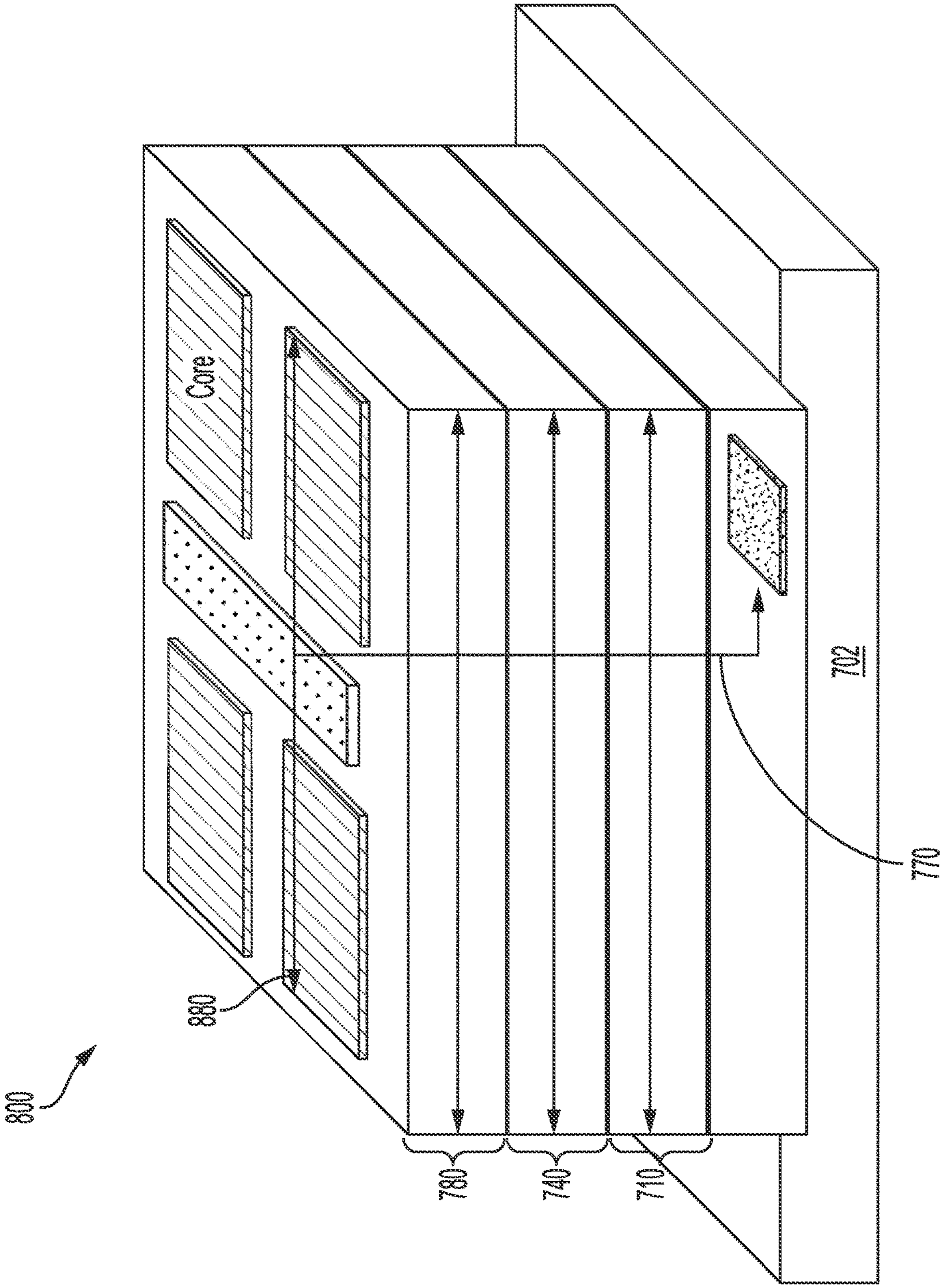
FIGS. 8A and 8B are perspective views illustrating multi-stacked integrated circuit (IC) dies, having a via-last through substrate via to provide cross-tier interconnect connection, according to various aspects of the present disclosure.
Figure 8B:
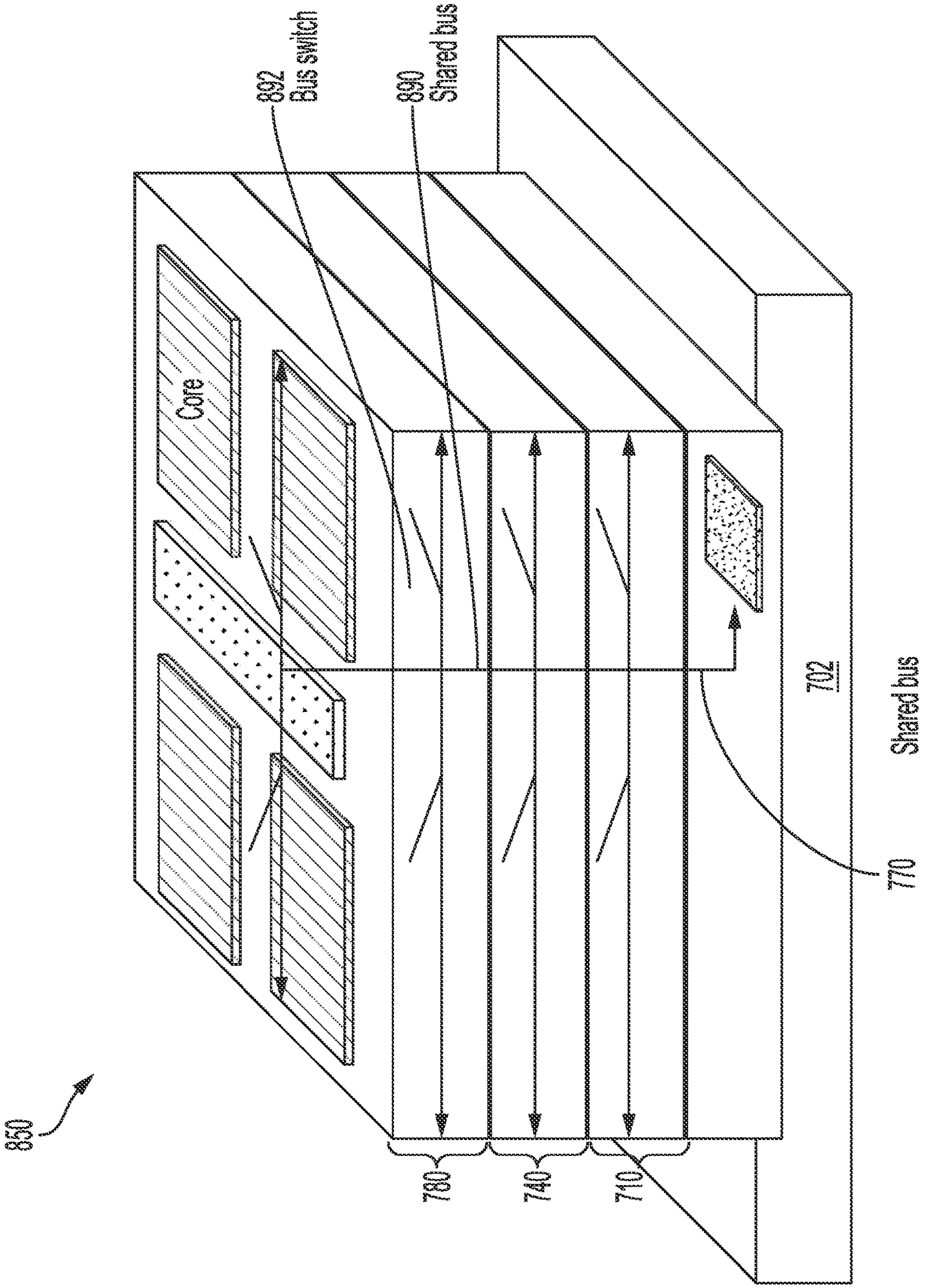

FIGS. 8A and 8B are perspective views illustrating multi-stacked integrated circuit (IC) dies, having a via-last through substrate via to provide cross-tier interconnect connection, according to various aspects of the present disclosure. As shown in FIG. 8A, the first multi-stack of integrated circuit (IC) dies 800 includes multiple cores, the carrier wafer 702, the first die 710, the second die 740, and the third die 780 of FIG. 7C and is described using similar reference numbers. FIG. 8A illustrates a shared power delivery network (PDN)/clocking configuration of the first multi-stack of IC dies 800, in which the TSV 770 extends through the third die 780, the second die 740, and the first die 710 to form a shared PDN/clock network 880. In a shared PDN configuration, the shared PDN/clock network 880 provides common power and ground connections across the multi-stack of IC dies 800. In a shared clock network configuration, the shared PDN/clock network 880 provides synchronous clocking across the multi-stack of IC dies 800. A process of fabricating the first multi-stack of IC dies 800 is illustrated, for example, in FIG. 9.

As shown in FIG. 8B, a second multi-stack of IC dies 850 also includes multiple cores, the carrier wafer 702, the first die 710, the second die 740, and the third die 780 of FIG. 7C and is described using similar reference numbers. FIG. 8B illustrates a shared bus configuration of the second multi-stack of IC dies 850, in which the TSV 770 extends through the third die 780, the second die 740, and the first die 710 to form a shared bus 890, including bus switches 892. In various aspects of the present disclosure, the shared bus configuration of the second multi-stack of IC dies 850 provides a shared bus connection across memory, in which the bus switches 982 control access to the shared bus 890. A process of fabricating second multi-stack of IC dies 850 is illustrated, for example, in FIG. 9.

Figure 9:
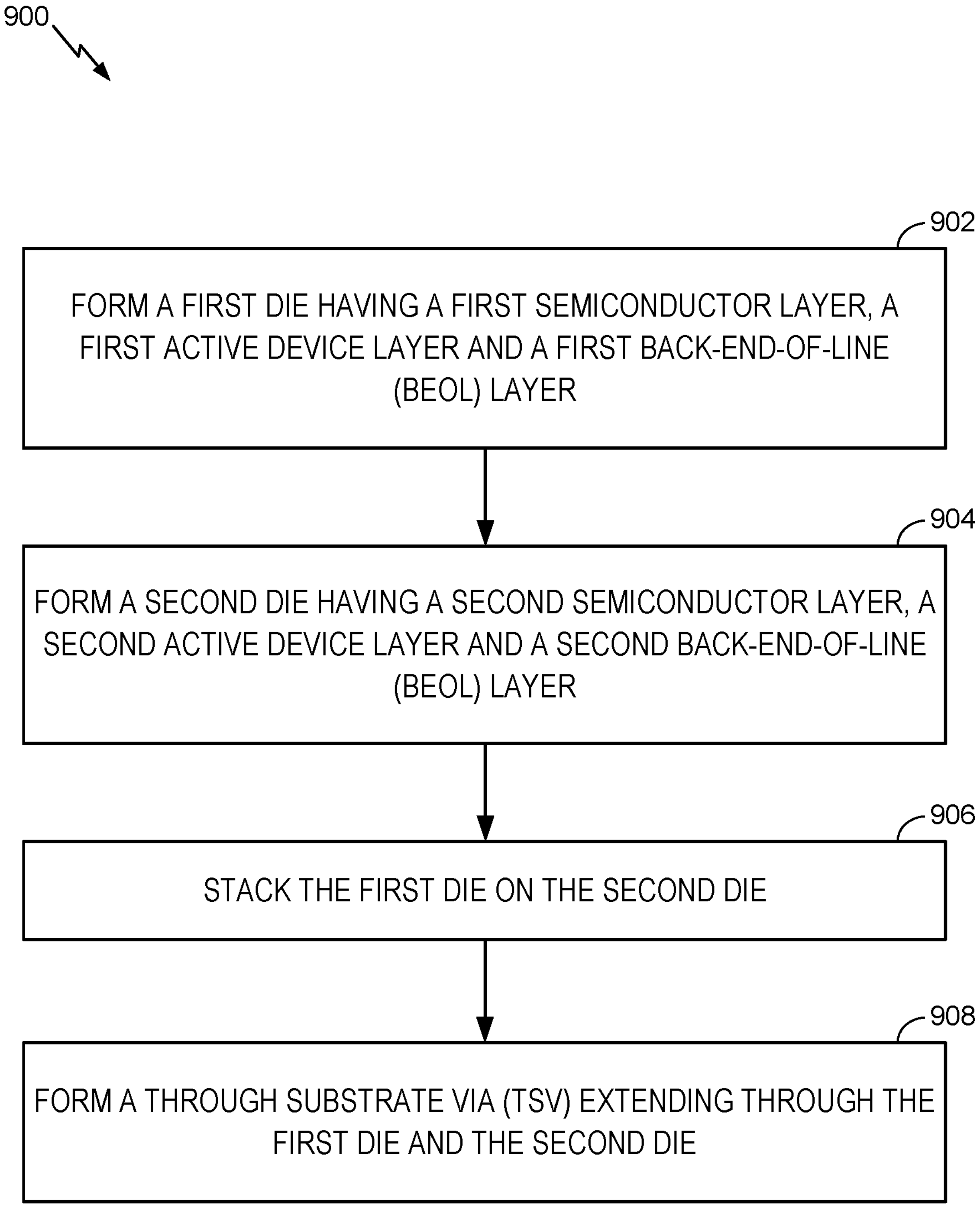
FIG. 9 is a process flow diagram illustrating a method for fabricating stacked integrated circuit (IC) dies, having a via-last through substrate via to provide cross-tier interconnect connections, according to various aspects of the present disclosure.

FIG. 9 is a process flow diagram illustrating a method for fabricating stacked integrated circuit (IC) dies, having a via-last through substrate via to provide cross-tier interconnect connections, according to various aspects of the present disclosure. A method 900 begins at block 902, in which a first die is formed, having a first semiconductor layer, a first active device layer and a first back-end-of-line (BEOL) layer. For example, as shown in FIG. 3, the IC device 300 includes the first die 310 having the first semiconductor layer 312, the first active device layer 314, and the first back-end-of-line (BEOL) layer 320, supported by the carrier wafer 302.

A block 904, a second die is formed, having the second semiconductor layer, the second active device layer, and the second back-end-of-line (BEOL) layer. For example, as shown in FIG. 3, the IC device 300 includes a second die 340, having a second semiconductor layer 342, a second active device layer 344, and a second back-end-of-line (BEOL) layer 350. At block 906, the first die is stacked on the second die. For example, as shown in FIG. 4C, at step 420, the second die 340, including a second sacrificial dielectric material 422, is stacked on the first die 310.

Additionally, the second die 340 and the first die 310 are further thinned to the predetermined thickness. In various aspects of the present disclosure, the first die 310 is bonded to the second die 340 using an oxide/dielectric bond.

At block 908, a through substrate via (TSV) is formed extending through the first die and the second die. For example, as shown in FIG. 4H, at step 470, a recess etch (e.g., trim) of the TSV outer layer 374 is performed. Once the recess etch is completed, an electroplating process of a conductive material (e.g., electroplated copper (Cu)) is performed on the TSV outer layer 374 to form the TSV core 372 of the TSV 370. This process is completed by singulating the stacked wafers into dies after all wafer-level processing steps. In various aspects of the present disclosure, the TSV 370 is composed of a multilayer conductive material, including the TSV core 372 and the TSV outer layer 374 to complete formation of the IC device 300, as shown in FIG. 3.

Figure 10:
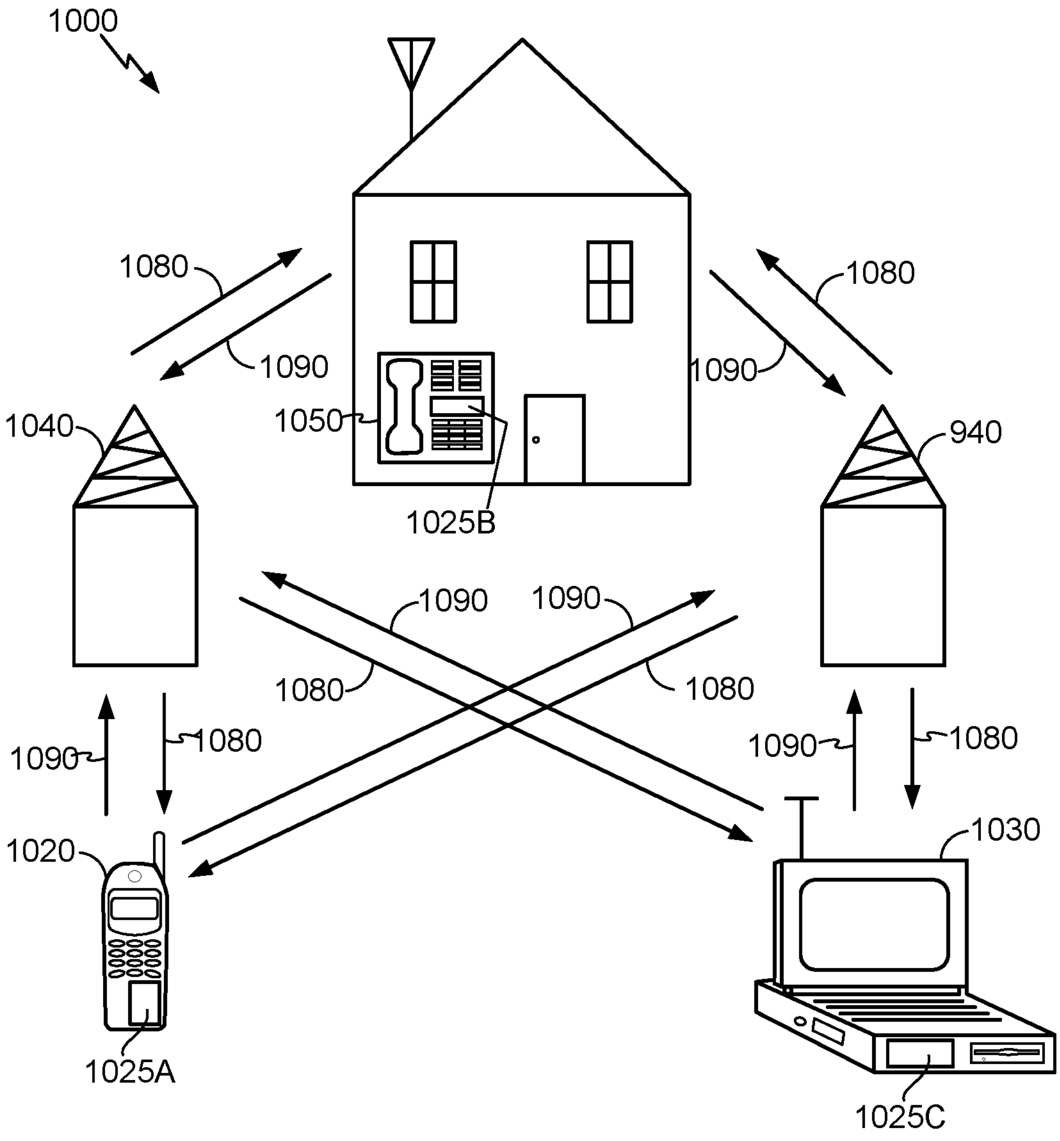
FIG. 10 is a block diagram showing an exemplary wireless communications system in which a configuration of the disclosure may be advantageously employed.

FIG. 10 is a block diagram showing an exemplary wireless communications system 1000 in which an aspect of the disclosure may be advantageously employed. For purposes of illustration, FIG. 10 shows three remote units 1020, 1030, and 1050, and two base stations 1040. It will be recognized that wireless communications systems may have many more remote units and base stations. Remote units 1020, 1030, and 1050 include integrated circuit (IC) devices 1025A, 1025C, and 1025B that include the disclosed stacked integrated circuit (IC) dies, having via-last through substrate vias (TSVs) to provide cross-tier interconnect connections. It will be recognized that other devices may also include the disclosed stacked IC dies having via-last TSVs to provide cross-tier interconnect connections, such as the base stations 1040, switching devices, and network equipment. FIG. 10 shows forward link signals 1080 from the base stations 1040 to the remote units 1020, 1030, and 1050, and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 10 illustrates remote units according to aspects of the present disclosure, the disclosure is not limited to these exemplary illustrated units. Aspects of the present disclosure may be suitably employed in many devices, which include the disclosed to provide cross-tier interconnect connections.

Figure 11:
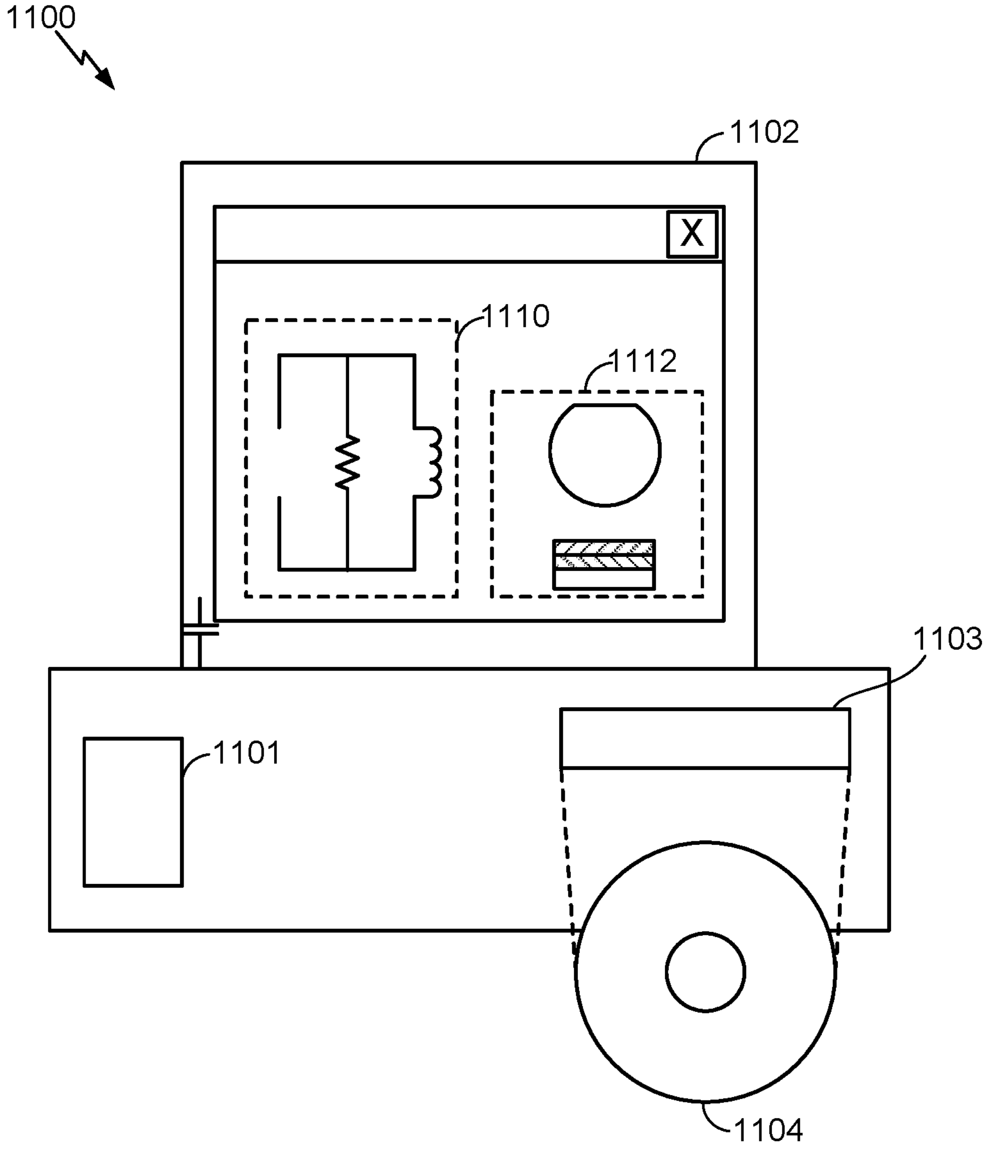
FIG. 11 is a block diagram illustrating a design workstation used for circuit, layout, and logic design of a semiconductor component, according to one configuration.

FIG. 11 is a block diagram illustrating a design workstation used for circuit, layout, and logic design of a semiconductor component, such as the stacked IC dies having via-last TSV to provide cross-tier interconnect connections s disclosed above. A design workstation 1100 includes a hard disk 1101 containing operating system software, support files, and design software such as Cadence or OrCAD. The design workstation 1100 also includes a display 1102 to facilitate design of a circuit 1110 or an integrated circuit (IC) component 1112 such as a stacked IC dies having via-last TSVs to provide cross-tier interconnect connections. A storage medium 1104 is provided for tangibly storing the design of the circuit 1110 or the IC component 1112 (e.g., the stacked IC dies having via-last TSVs to provide cross-tier interconnect connections). The design of the circuit 1110 or the IC component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the IC component 1112 by decreasing the number of processes for designing semiconductor wafers.

Implementation examples are described in the following numbered clauses:

1. An integrated circuit (IC), comprising:
   - a first die having a first semiconductor layer, a first active device layer and a first back-end-of-line (BEOL) layer;
   - a second die having a second semiconductor layer, a second active device layer and a second back-end-of-line (BEOL) layer, and on the first die; and
   - a through substrate via (TSV) extending through the first die and the second die.
2. The IC of clause 1, in which a diameter of the TSV extending through the second semiconductor layer of the second die equals a diameter of the TSV extending through the first BEOL layer of the first die.
3. The IC of any of clauses 1 or 2, in which the first BEOL layer of the first die is coupled to the second semiconductor layer of the second die to stack the first die on the second die, and the TSV extends from and through the first semiconductor layer of the first die to and through the second BEOL layer of the second die.
4. The IC of any of clauses 1-3, further comprising:
   - first dielectric liners separating the TSV from the first semiconductor layer and the first active device layer of the first die; and
   - second dielectric liners separating the TSV from the second semiconductor layer and the second active device layer of the second die.
5. The IC of any of clauses 1-4, in which the second BEOL layer comprises a wrap-around contact coupled to the TSV and coupled to an interconnect of the second BEOL layer.
6. The IC of clause 5, further comprising a dielectric liner on the wrap-around contact and coupled to the interconnect of the second BEOL layer.
7. The IC of any of clauses 1-6, in which the first BEOL layer comprises a wrap-around contact coupled to the TSV and coupled to an interconnect of the first BEOL layer.
8. The IC of clause 7, further comprising a dielectric liner on the wrap-around contact and coupled to the interconnect of the first BEOL layer.
9. The IC of any of clauses 1-8, in which the TSV comprises a multilayer conductive material.
10. The IC of clause 9, in which the multilayer conductive material comprises at least one of aluminum (Al), copper (Cu), cobalt (Co), ruthenium (Ru), and tungsten (W).
11. A method for fabricating stacked integrated circuit (IC) dies, comprising:

forming a first die having a first semiconductor layer, a first active device layer and a first back-end-of-line (BEOL) layer;

forming a second die having a second semiconductor layer, a second active device layer and a second back-end-of-line (BEOL) layer;

stacking the first die on the second die; and forming a through substrate via (TSV) extending through the first die and the second die.

12. The method of clause 11, in which a diameter of the TSV extending through the second semiconductor layer of the second die equals a diameter of the TSV extending through the first BEOL layer of the first die.

13. The method of any of clauses 11 or 12, in which the first BEOL layer of the first die is coupled to the second semiconductor layer of the second die to stack the first die on the second die, and the TSV extends from and through the first semiconductor layer of the first die to and through the second BEOL layer of the second die.

14. The method of any of clauses 11-13, further comprising:

depositing first dielectric liners separating the TSV from the first semiconductor layer and the first active device layer of the first die; and depositing second dielectric liners separating the TSV from the second semiconductor layer and the second active device layer of the second die.

15. The method of any of clauses 11-14, in which the second BEOL layer comprises a wrap-around contact coupled to the TSV and coupled to an interconnect of the second BEOL layer.

16. The method of clause 15, further comprising depositing a dielectric liner on the wrap-around contact and coupled to the interconnect of the second BEOL layer.

17. The method of any of clauses 11-16, in which the first BEOL layer comprises a wrap-around contact coupled to the TSV and coupled to an interconnect of the first BEOL layer.

18. The method of clause 17, further comprising depositing a dielectric liner on the wrap-around contact and coupled to the interconnect of the first BEOL layer.

19. The method of any of clauses 11-18, in which the TSV comprises a multilayer conductive material.

20. The method of clause 19, in which the multilayer conductive material comprises at least one of aluminum (Al), copper (Cu), cobalt (Co), ruthenium (Ru), and tungsten (W).

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the application and design constraints imposed on the overall system. Skilled artisans may implement the described functionality in varying ways for each application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit (IC), comprising:

a first die having a first semiconductor layer, a first active device layer and a first back-end-of-line (BEOL) layer;

a second die having a second semiconductor layer, a second active device layer and a second back-end-of-line (BEOL) layer, and on the first die; and a through substrate via (TSV) extending through the first die and the second die, wherein the second BEOL layer comprises a wrap-around contact coupled to the TSV and coupled to an interconnect of the second BEOL layer.

2. The IC of claim 1, in which a diameter of the TSV extending through the second semiconductor layer of the second die equals a diameter of the TSV extending through the first BEOL layer of the first die.

3. The IC of claim 1, in which the first BEOL layer of the first die is coupled to the second semiconductor layer of the second die to stack the first die on the second die, and the TSV extends from and through the first semiconductor layer of the first die to and through the second BEOL layer of the second die.

4. The IC of claim 1, further comprising:

first dielectric liners separating the TSV from the first semiconductor layer and the first active device layer of the first die; and second dielectric liners separating the TSV from the second semiconductor layer and the second active device layer of the second die.

5. The IC of claim 1, further comprising a dielectric liner on the wrap-around contact and coupled to the interconnect of the second BEOL layer.

6. The IC of claim 1, in which the first BEOL layer comprises a second wrap-around contact coupled to the TSV and coupled to an interconnect of the first BEOL layer.

7. The IC of claim 6, further comprising a dielectric liner on the second wrap-around contact and coupled to the interconnect of the first BEOL layer.

8. The IC of claim 1, in which the TSV comprises a multilayer conductive material.

9. The IC of claim 8, in which the multilayer conductive material comprises at least one of aluminum (Al), copper (Cu), cobalt (Co), ruthenium (Ru), and tungsten (W).

10. A method for fabricating stacked integrated circuit (IC) dies, comprising:

forming a first die having a first semiconductor layer, a first active device layer and a first back-end-of-line (BEOL) layer;

forming a second die having a second semiconductor layer, a second active device layer and a second back-end-of-line (BEOL) layer;

stacking the first die on the second die; and forming a through substrate via (TSV) extending through the first die and the second die, wherein the second BEOL layer comprises a wrap-around contact coupled to the TSV and coupled to an interconnect of the second BEOL layer, or wherein the first BEOL layer comprises a wrap-around contact coupled to the TSV and coupled to an interconnect of the first BEOL layer.

11. The method of claim 10, in which a diameter of the TSV extending through the second semiconductor layer of the second die equals a diameter of the TSV extending through the first BEOL layer of the first die.

12. The method of claim 10, in which the first BEOL layer of the first die is coupled to the second semiconductor layer of the second die to stack the first die on the second die, and the TSV extends from and through the first semiconductor layer of the first die to and through the second BEOL layer of the second die.

13. The method of claim 10, further comprising:

depositing first dielectric liners separating the TSV from the first semiconductor layer and the first active device layer of the first die; and depositing second dielectric liners separating the TSV from the second semiconductor layer and the second active device layer of the second die.

14. The method of claim 10, further comprising depositing a dielectric liner on the wrap-around contact and coupled to the interconnect of the second BEOL layer.

15. The method of claim 10, further comprising depositing a dielectric liner on the wrap-around contact and coupled to the interconnect of the first BEOL layer.

16. The method of claim 10, in which the TSV comprises a multilayer conductive material.

17. The method of claim 16, in which the multilayer conductive material comprises at least one of aluminum (Al), copper (Cu), cobalt (Co), ruthenium (Ru), and tungsten (W).

18. An integrated circuit (IC), comprising:

a first die having a first semiconductor layer, a first active device layer and a first back-end-of-line (BEOL) layer;

a second die having a second semiconductor layer, a second active device layer and a second back-end-of-line (BEOL) layer, and on the first die; and a through substrate via (TSV) extending through the first die and the second die, wherein the first BEOL layer comprises a wrap-around contact coupled to the TSV and coupled to an interconnect of the first BEOL layer.

19. The IC of claim 18, in which a diameter of the TSV extending through the second semiconductor layer of the second die equals a diameter of the TSV extending through the first BEOL layer of the first die.

20. The IC of claim 19, in which the first BEOL layer of the first die is coupled to the second semiconductor layer of the second die to stack the first die on the second die, and the TSV extends from and through the first semiconductor layer of the first die to and through the second BEOL layer of the second die.

* * * * *